US007179578B2

(12) United States Patent
Sato et al.

(10) Patent No.: US 7,179,578 B2
(45) Date of Patent: Feb. 20, 2007

(54) POSITIVE RESIST COMPOSITION

(75) Inventors: Kenichiro Sato, Shizuoka (JP); Kazuya Uenishi, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 19 days.

(21) Appl. No.: 10/114,985

(22) Filed: Apr. 4, 2002

(65) Prior Publication Data

US 2003/0054286 A1 Mar. 20, 2003

(30) Foreign Application Priority Data

Apr. 5, 2001 (JP) ............. P.2001-107304
Apr. 5, 2001 (JP) ............. P.2001-107305

(51) Int. Cl.
*G03F 7/004* (2006.01)
(52) U.S. Cl. .............. 430/270.1; 430/905; 430/910; 526/319; 526/320; 526/328
(58) Field of Classification Search ............ 430/270.1, 430/905, 910; 526/319, 320, 328
See application file for complete search history.

(56) References Cited

U.S. PATENT DOCUMENTS 6,291,130 B1* 9/2001 Kodama et al. ......... 430/270.1

| 6,440,636 | B1* | 8/2002 | Ushirogouchi et al. .. 430/270.1 |
| 6,627,381 | B1* | 9/2003 | Uetani et al. ............. 430/270.1 |
| 2002/0009666 | A1* | 1/2002 | Sato et al. ................ 430/270.1 |
| 2002/0164540 | A1* | 11/2002 | Nakanishi et al. ....... 430/270.1 |

FOREIGN PATENT DOCUMENTS

JP 9-73173 A 3/1997
JP 11-119434 A 4/1999

* cited by examiner

*Primary Examiner*—Amanda Walke
(74) *Attorney, Agent, or Firm*—Sughrue Mion, PLLC

(57) ABSTRACT

To provide a positive resist composition having high sensitivity, small defocus latitude depended on line pitch and less surface roughening at the etching, which can be suitably used for micro-photofabrication using far ultraviolet ray, particularly, ArF excimer laser ray.

A positive resist composition comprising (A) a resin containing specific two kinds of repeating units, which has an aliphatic cyclic hydrocarbon group on the side chain and increases the dissolution rate in an alkali developer under the action of an acid, and (B) a specific compound capable of generating an acid upon irradiation with actinic rays or radiation, or a positive resist composition comprising (A) two kinds of resins as the resin having an aliphatic cyclic hydrocarbon group on the side chain and capable of increasing the dissolution rate in an alkali developer under the action of an acid, and (B) a compound capable of generating an acid upon irradiation with actinic rays or radiation.

11 Claims, No Drawings

POSITIVE RESIST COMPOSITION

FIELD OF THE INVENTION

The present invention relates to a positive (working) resist composition for use in the ultra-microlithography process at the production of VLSI or high-capacity microchip, or other photo-fabrication processes.

BACKGROUND OF THE INVENTION

The integration degree of integrated circuits is recently more and more increasing and in the production of a semiconductor substrate of VLSI (i.e., i.e., ultra-LSL) or the like, an ultrafine pattern comprising lines having a width of half-micron or less must be processed. For satisfying this requirement, the wavelength used by an exposure apparatus for use in lithography is more and more shifted to a shorter wave and at present, studies are being made on the use of excimer laser light (e.g., XeCl, KrF, ArF) at a shorter wavelength out of far ultraviolet rays.

For the pattern formation of lithography in this wavelength region, a chemical amplification-type resist is used.

The chemical amplification-type resist in general can be roughly classified into three groups commonly called 2-component system, 2.5-component system and 3-component system. The 2-component system uses a combination of a compound capable of generating an acid upon photochemical decomposition (hereinafter referred to as a "photo-acid generator") and a binder resin. This binder resin is a resin having in its molecule a group capable of decomposing under the action of an acid and thereby increasing the solubility of the resin in an alkali developer (sometimes referred to as an "acid decomposable group"). The 2.5-component system further contains a low molecular compound having an acid decomposable group in addition to the 2-component system. The 3-component system contains a photo-acid generator, an alkali-soluble resin and the above-described low molecular compound.

This chemical amplification-type resist is suitable as a photoresist for the irradiation with ultraviolet ray or far ultraviolet ray but must further respond to the required properties on use.

With respect to the photoresist composition for ArF light source, a resin where an alicyclic hydrocarbon site is introduced for the purpose of imparting dry etching resistance has been proposed. However, the introduction of alicyclic hydrocarbon site incurs a problem, that is, the system becomes very hydrophobic, as a result, the development with an aqueous tetramethylammonium hydroxide (hereinafter referred to as "TMAH") solution which has been heretofore widely used as a resist developer cannot be performed or there occurs a phenomenon such that the resist falls off from the substrate during the development.

To cope with this hydrophobitization of resist, an organic solvent such as isopropyl alcohol is mixed in the developer and there is provided an effect, however, the problem is not completely solved because the resist film may swell or the process becomes cumbersome. From the standpoint of improving the resist, a large number of techniques have been proposed to compensate for various hydrophobic alicyclic hydrocarbon sites by the introduction of a hydrophilic group.

JP-A-9-73173 (the term "JP-A" as used herein means an "unexamined published Japanese patent application") describes a resist material using an acid-responsive compound containing a structure unit which contains an alkali-soluble group protected by an alicyclic group-containing structure and renders the compound alkali-soluble upon elimination of the alkali-soluble group under the action of an acid.

JP-A-11-119434 describes a resist material using a resin containing a repeating unit having an alicyclic hydrocarbon and a repeating unit having a lactone structure, which is an inexpensive resist material having high resolution and high sensitivity and improved in the dry etching resistance.

However, in the micro-photofabrication using far ultraviolet ray, particularly, ArF excimer laser ray, these conventional positive resist compositions fail in providing good results in view of sensitivity, defocus latitude depended on line pitch or surface roughening at the etching.

SUMMARY OF THE INVENTION

Accordingly, the object of the present invention is to provide a positive resist composition having high sensitivity, small defocus latitude depended on line pitch and reduced surface roughening at the etching, which can be suitably used in the micro-photofabrication using far ultraviolet ray, particularly, ArF excimer laser ray.

As a result of extensive investigations on the constituent materials of positive chemical amplification-type resist composition, the present inventors have found that the object of the present invention can be attained by the use of a specific acid decomposable resin. The present invention has been accomplished based on this finding.

More specifically, the above-described object can be attained by the following constructions.

(1) A positive resist composition comprising (A) a resin containing a repeating unit represented by the following formula (Ia) and a repeating unit represented by formula (Ib), which is a resin having an aliphatic cyclic hydrocarbon group on the side chain and capable of increasing the dissolution rate in an alkali developer under the action of an acid, and (B) a compound capable of generating an acid upon irradiation with actinic rays or radiation:

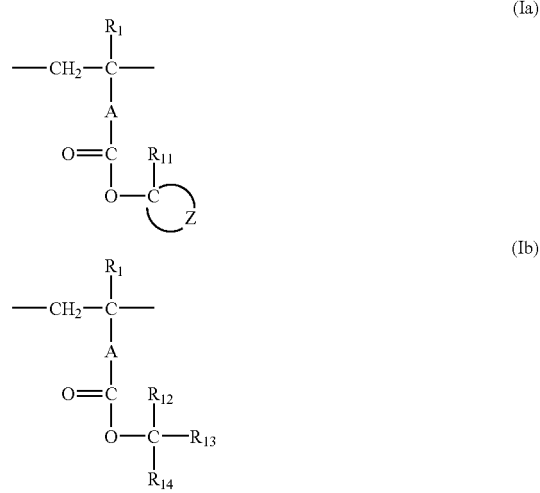

wherein in formulae (Ia) and (IIb), each $R_1$ independently represents a hydrogen atom or an alkyl group and A represents a linking group, in formula (Ia), $R_{11}$ represents an alkyl group having from 1 to 4 carbon atoms and Z represents an atomic group necessary for forming an alicyclic hydrocarbon group together with the carbon atom, and in formula (Ib), $R_{12}$ to $R_{14}$ each independently represents a hydrocarbon group, provided that at least one of $R_{12}$ to $R_{14}$ represents an alicyclic hydrocarbon group.

(2) The positive resist composition as described in (1), which further contains (C) a fluorine-containing surfactant and/or a silicon-containing surfactant.

(3) The positive resist composition as described in (1) or (2), which further contains (D) an organic basic compound.

(4) A positive resist composition comprising (A) a resin containing a repeating unit represented by the following formula (Ia) and a resin containing a repeating unit represented by formula (Ib), which are a resin having an aliphatic cyclic hydrocarbon group on the side chain and capable of increasing the dissolution rate in an alkali developer under the action of an acid, and (B) a compound capable of generating an acid upon irradiation with actinic rays or radiation:

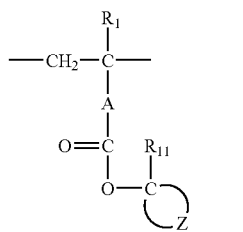

(Ia)

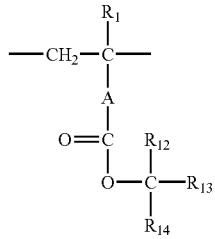

(Ib)

wherein in formulae (Ia) and (IIb), each $R_1$ independently represents a hydrogen atom or an alkyl group and A represents a linking group, in formula (Ia), $R_{11}$ represents an alkyl group having from 1 to 4 carbon atoms and Z represents an atomic group necessary for forming an alicyclic hydrocarbon group together with the carbon atom, and in formula (Ib), $R_{12}$ to $R_{14}$ each independently represents a hydrocarbon group, provided that at least one of $R_{12}$ to $R_{14}$ represents an alicyclic hydrocarbon group.

(5) The positive resist composition as described in (4), which further contains (C) a fluorine-containing surfactant and/or a silicon-containing surfactant.

(6) The positive resist composition as described in (4) or (5), which further contains (D) an organic basic compound.

DETAILED DESCRIPTION OF THE INVENTION

The components for use in the present invention are described in detail below.

[1] (A) Resin capable of increasing dissolution rate in alkali developer under the action of acid (also referred to as "acid decomposable resin")

In the present invention, the acid decomposable resin may be a resin having both a repeating unit represented by formula (Ia) and a repeating unit represented by formula (Ib) or a combination of a resin (Aa) having a repeating unit represented by formula (Ia) and a resin (Ab) having a repeating unit represented by formula (Ib).

In formulae (Ia) and (Ib), each $R_1$ independently represents a hydrogen atom or an alkyl group. The alkyl group represented by $R_1$ is preferably an alkyl group having from 1 to 4 carbon atoms (e.g., methyl, ethyl, propyl, isopropyl, n-butyl, isobutyl, sec-butyl, tert-butyl). Each $R_1$ is more preferably a hydrogen atom or a methyl group.

A represents a linking group and generally represents a single bond or a sole group or a combination of two or more groups, selected from the group consisting of an alkylene group, a substituted alkylene group, an ether group, a thioether group, a carbonyl group, an ester group, an amido group, a sulfonamide group, a urethane group and a urea group. The linking group represented by A preferably has 10 or less carbon atoms.

Examples of the alkylene group for A include the group represented by the following formula:

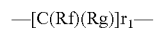

—[C(Rf)(Rg)]$r_1$—

In the formula, Rf and Rg, which may be the same or different, each represents a hydrogen atom, an alkyl group, a substituted alkyl group, a halogen atom, a hydroxyl group or an alkoxy group. The alkyl group is preferably a lower alkyl group such as methyl group, ethyl group, propyl group, isopropyl group and butyl group, more preferably a methyl group, an ethyl group, a propyl group or an isopropyl group. Examples of the substituent of the substituted alkyl group include a hydroxyl group, a halogen atom and an alkoxy group. Examples of the alkoxy group include an alkoxy group having from 1 to 4 carbon atoms, such as methoxy group, ethoxy group, propoxy group and butoxy group. Examples of the halogen atom include a chlorine atom, a bromine atom, a fluorine atom and an iodine atom. $r_1$ is an integer of 1 to 10.

In formula (Ia), $R_{11}$ represents an alkyl group having from 1 to 4 carbon atoms (e.g., methyl, ethyl, propyl, isopropyl, n-butyl, isobutyl, sec-butyl, tert-butyl), and Z represents an atomic group necessary for forming an alicyclic hydrocarbon group together with the carbon atom.

In formula (Ib), $R_{12}$ to $R_{14}$ each independently represents a hydrocarbon group, provided that at least one of $R_{12}$ to $R_{14}$ represents an alicyclic hydrocarbon group.

The hydrocarbon group represented by $R_{12}$ to $R_{13}$ other than the alicyclic hydrocarbon group is preferably a linear or branched alkyl group having from 1 to 15 carbon atoms (more preferably from 1 to 4 carbon atoms).

The alicyclic hydrocarbon group for $R_{12}$ to $R_{14}$ and the alicyclic hydrocarbon group formed by Z and the carbon atom each may be monocyclic or polycyclic. Specific examples thereof include a group having 5 or more carbon atoms and having a monocyclo-, bicyclo-, tricyclo- or tetracyclo-structure. The number of carbon atoms is preferably from 6 to 30, more preferably from 7 to 25. These alicyclic hydrocarbon groups each may have a substituent.

Examples of the structure in the alicyclic moiety of the alicyclic hydrocarbon group are set forth below.

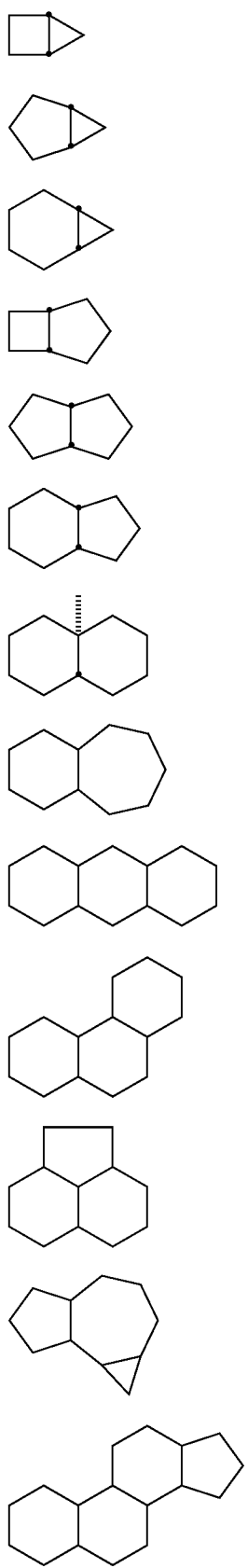
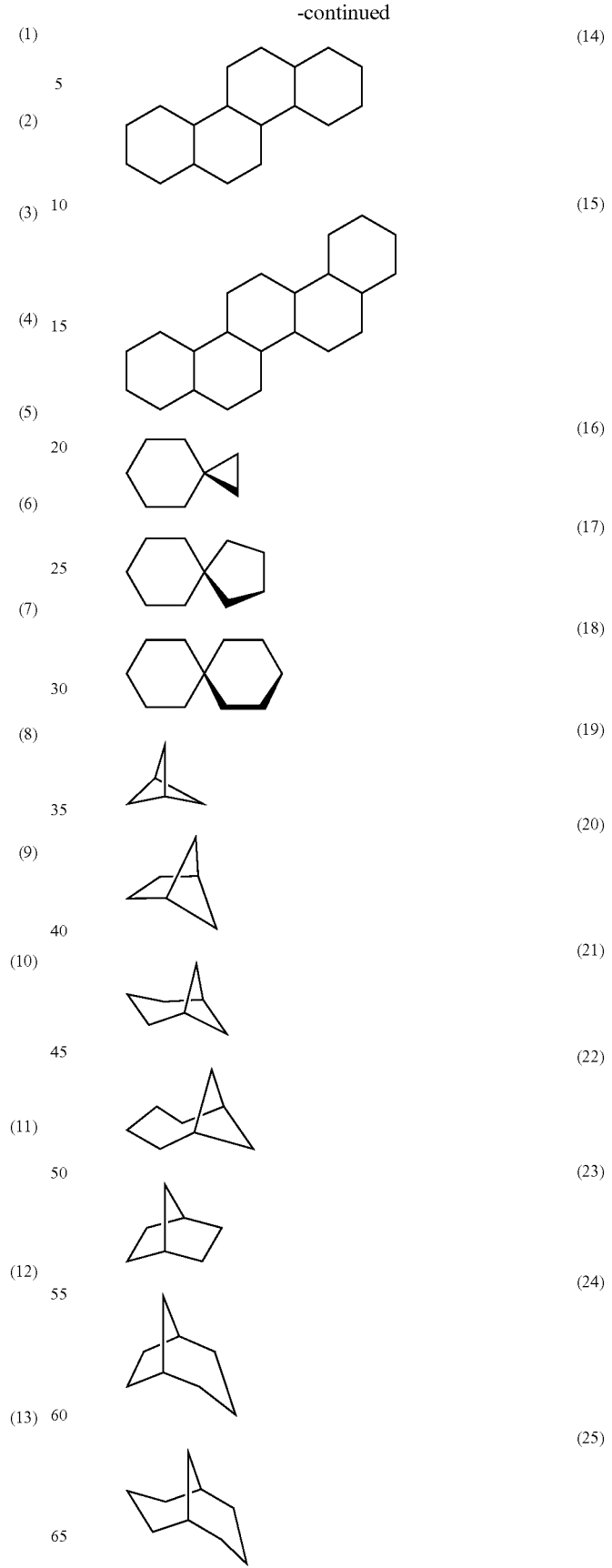

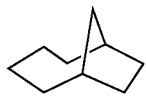
(26)
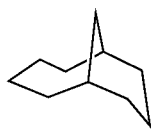
(27)
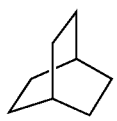
(28)
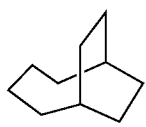
(29)
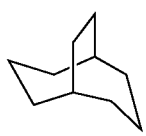
(30)
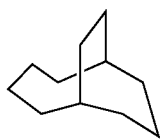
(31)
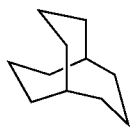
(32)
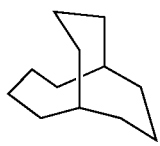
(33)
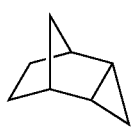
(34)
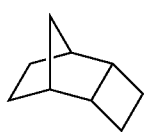
(35)
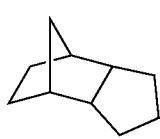
(36)
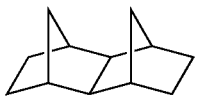
(37)
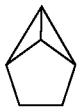
(38)
(39)
(40)
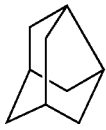
(41)
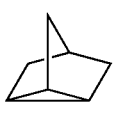
(42)
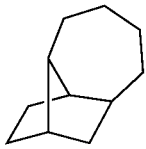
(43)
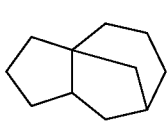
(44)
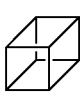
(45)
(46)
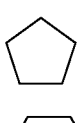
(47)
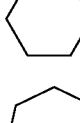
(48)
(49)

-continued

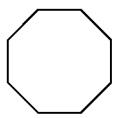
(50)

Among the above-described alicyclic moieties, preferred in the present invention are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent of the alicyclic hydrocarbon group include an alkyl group, a substituted alkyl group, a halogen atom, a hydroxyl group and a carbonyl group (=O). The alkyl group is preferably a lower alkyl group such as methyl group, ethyl group, propyl group, isopropyl group and butyl group, more preferably a methyl group, an ethyl group, a propyl group or an isopropyl group. Examples of the substituent of the substituted alkyl group include a hydroxyl group, a halogen atom and an alkoxy group. Examples of the alkoxy group include an alkoxy group having from 1 to 4 carbon atoms, such as methoxy group, ethoxy group, propoxy group and butoxy group.

Specific examples of the monomer corresponding to the repeating unit represented by formula (Ia) or (Ib) are set forth below.

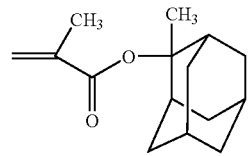
Ia-1

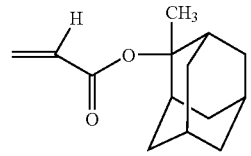
Ia-2

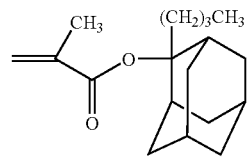
Ia-3

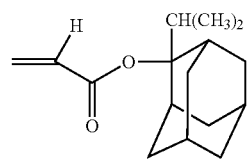
Ia-4

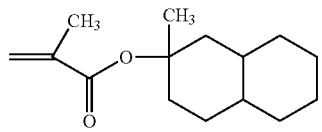
Ia-5

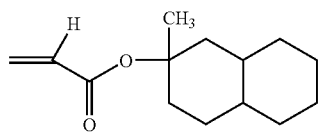
Ia-6

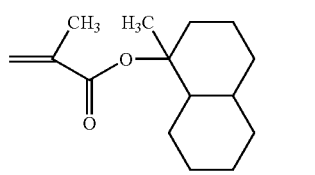
Ia-7

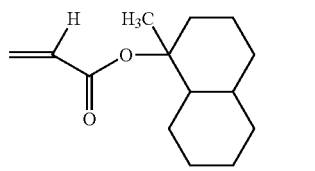
Ia-8

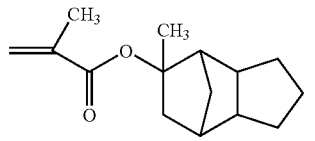
Ia-9

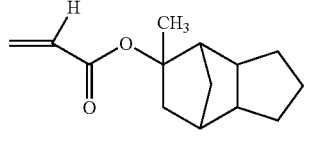
Ia-10

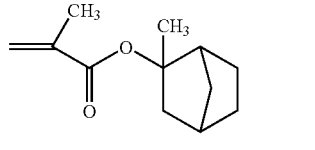
Ia-11

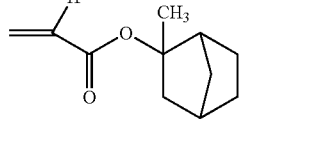
Ia-12

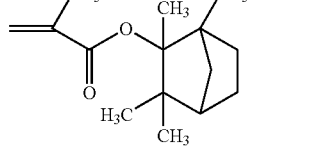
Ia-13

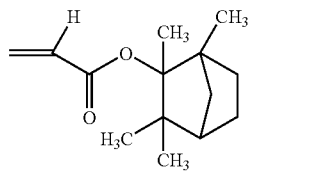
Ia-14

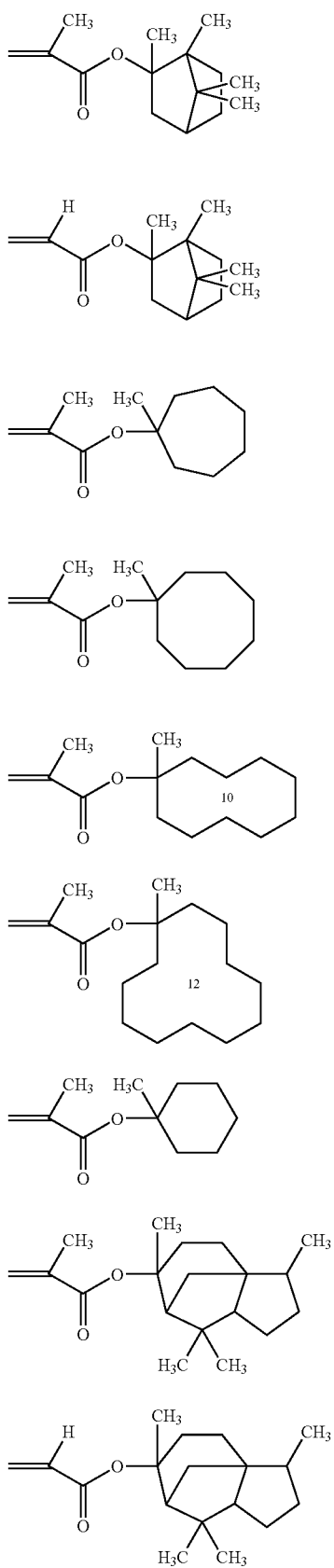
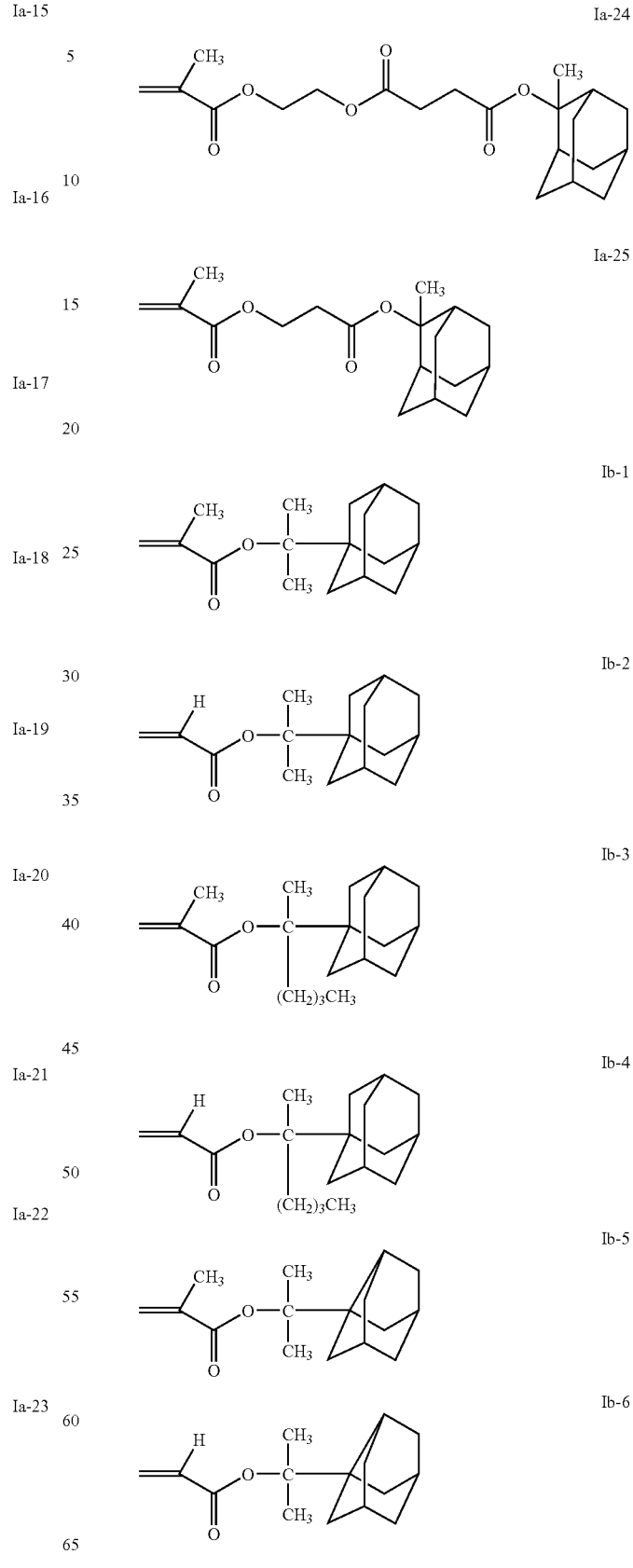

-continued

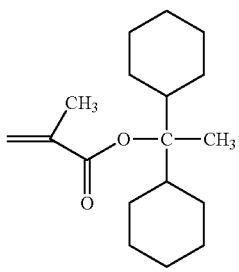

Ib-7

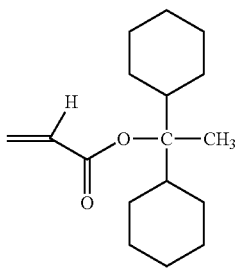

Ib-8

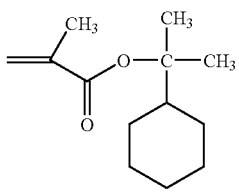

Ib-9

The acid decomposable resin (A) for use in the present invention may further contain a repeating unit having a partial structure containing an alicyclic hydrocarbon, represented by the following formula (pIII), (pIV) or (pV):

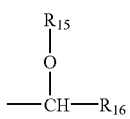  (pIII)

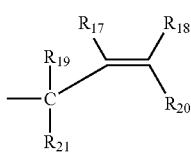  (pIV)

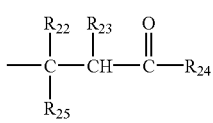  (pV)

wherein $R_{15}$ and $R_{16}$ each independently represents a linear or branched alkyl group having from 1 to 4 carbon atoms or an alicyclic hydrocarbon group, provided that either one of $R_{15}$ and $R_{16}$ represents an alicyclic hydrocarbon group;

$R_{17}$ to $R_{21}$ each independently represents a hydrogen atom, a linear or branched alkyl group having from 1 to 4 carbon atoms or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having from 1 to 4 carbon atoms or an alicyclic hydrocarbon group;

$R_{22}$ to $R_{25}$ each independently represents a linear or branched alkyl group having from 1 to 4 carbon atoms or an alicyclic hydrocarbon group, provided that at least one of $R_{22}$ to $R_{25}$ represents an alicyclic hydrocarbon group, and $R_{23}$ and $R_{24}$ may combine with each other to form a ring.

In formulae (pIII) to (pV), the alkyl group represented by $R_{15}$ to $R_{25}$ is a linear or branched alkyl group having from 1 to 4 carbon atoms, which may be substituted or unsubstituted. Examples of the alkyl group include a methyl group, an ethyl group, an n-propyl group, an isopropyl group, an n-butyl group, an isobutyl group, a sec-butyl group and a tert-butyl group.

Examples of the substituent of the alkyl group include an alkoxy group having from 1 to 4 carbon atoms, a halogen atom (e.g., fluorine, chlorine, bromine, iodine), an acyl group, an acyloxy group, a cyano group, a hydroxyl group, a carboxy group, an alkoxycarbonyl group and a nitro group.

The structure represented by formula (pIII), (pIV) or (pV) in the resin can be used for the protection of an alkali-soluble group. Examples of the alkali-soluble group include various groups known in this technical field.

Specific examples thereof include a carboxylic acid group, a sulfonic acid group, a phenol group and a thiol group. Among these, preferred are a carboxylic acid group and a sulfonic acid group.

Preferred examples of the alkali-soluble group protected by the structure represented by formula (pIII), (pIV) or (pV) in the resin include the groups represented by the following formulae (pVIII) to (pXI):

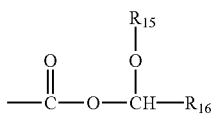  (pIX)

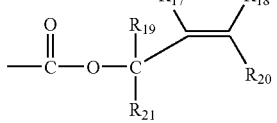  (pX)

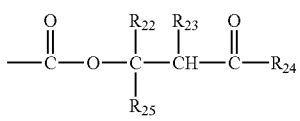  (pXI)

wherein $R_{15}$ to $R_{25}$ each has the same meaning as defined above.

In the above-described resin, the repeating unit having an alkali-soluble group protected by the structure represented by formula (pIII), (pIV) or (pV) is preferably the repeating unit represented by the following formula

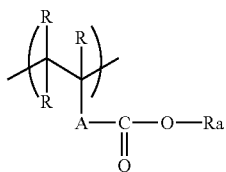
(pA)

wherein R represents a hydrogen atom, a halogen atom or a substituted or unsubstituted, linear or branched alkyl group having from 1 to 4 carbon atoms, and the plurality of Rs may be the same or different;

A has the same meaning as in formulae (Ia) and (Ib); and

Ra represents any one group of formulae (pIII) to (pV).

Specific examples of the repeating unit represented by formula (pA) are set forth below, however, the present invention is not limited thereto.

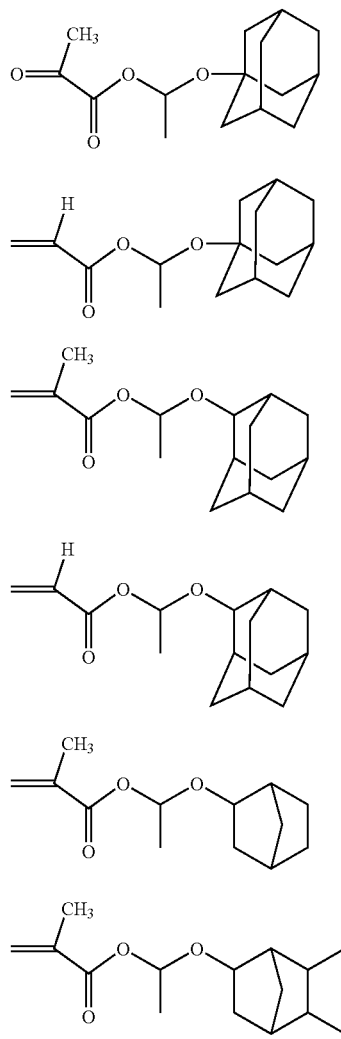

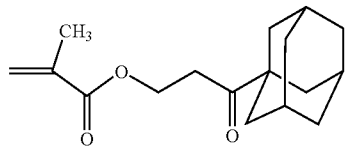

The acid decomposable resin for use in the present invention may further contain a repeating unit having a lactone structure, represented by the following formula

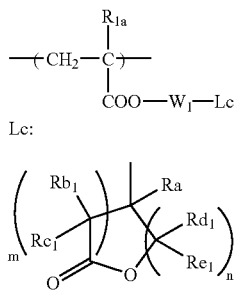
(IV)

wherein $R_{1a}$ represents a hydrogen atom or a methyl group;

$W_1$ represents a single bond or a sole group or a combination of two or more groups, selected from the group consisting of an alkylene group, an ether group, a thioether group, a carbonyl group and an ester group;

$Ra_1$, $Rb_1$, $Rc_1$, $Rd_1$ and $Re_1$ each independently represents a hydrogen atom or an alkyl group having from 1 to 4 carbon atoms; m and n each independently represents an integer of 0 to 3, and m+n is from 2 to 6.

Examples of the alkyl group having from 1 to 4 carbon atoms represented by $Ra_1$ to $Re_1$ include a methyl group, an ethyl group, a propyl group, an isopropyl group, an n-butyl group, an isobutyl group, a sec-butyl group and a tert-butyl group.

In formula (IV), examples of the alkylene group for $W_1$ include the group represented by the following formula:

In the formula, Rf and Rg, which may be the same or different, each represents a hydrogen atom, an alkyl group, a substituted alkyl group, a halogen atom, a hydroxyl group or an alkoxy group. The alkyl group is preferably a lower alkyl group such as methyl group, ethyl group, propyl group, isopropyl group and butyl group, more preferably a methyl group, an ethyl group, a propyl group or an isopropyl group. Examples of the substituent of the substituted alkyl group include a hydroxyl group, a halogen atom and an alkoxy group. Examples of the alkoxy group include an alkoxy group having from 1 to 4 carbon atoms, such as methoxy group, ethoxy group, propoxy group and butoxy group. Examples of the halogen atom include a chlorine atom, a bromine atom, a fluorine atom and an iodine atom. $r_1$ is an integer of 1 to 10.

Examples of the further substituent of the alkyl group include a carboxyl group, an acyloxy group, a cyano group, an alkyl group, a substituted alkyl group, a halogen atom, a hydroxyl group, an alkoxy group, a substituted alkoxy group, an acetylamido group, an alkoxycarbonyl group and an acyl group.

Here, examples of the alkyl group include a lower alkyl group such as methyl group, ethyl group, propyl group, isopropyl group, butyl group, cyclopropyl group, cyclobutyl group and cyclopentyl group; examples of the substituent of the substituted alkyl group include a hydroxyl group, a halogen atom and an alkoxy group; examples of the substituent of the substituted alkoxy group include an alkoxy group; examples of the alkoxy group include an alkoxy group having from 1 to 4 carbon atoms, such as methoxy group, ethoxy group, propoxy group and butoxy group; examples of the acyloxy group include an acetoxy group; and examples of the halogen atom include a chlorine atom, a bromine atom, a fluorine atom and an iodine atom.

Specific examples of the monomer corresponding to the repeating structural unit represented by formula (IV) are set forth below, however, the present invention is not limited thereto.

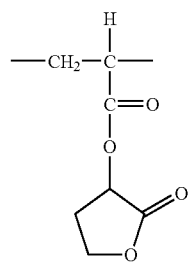
(IV-1)

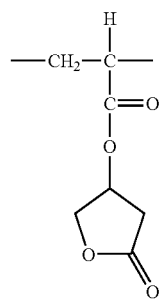
(IV-2)

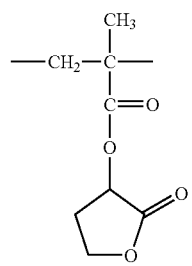
(IV-3)

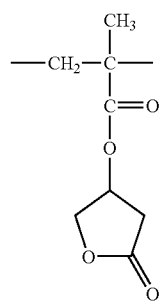
(IV-4)

-continued

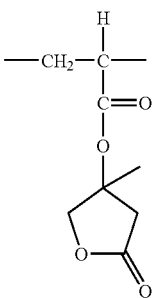
(IV-5)

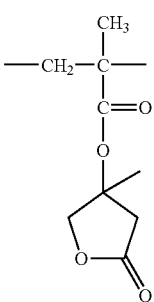
(IV-6)

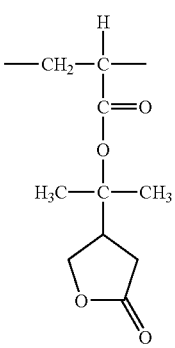
(IV-7)

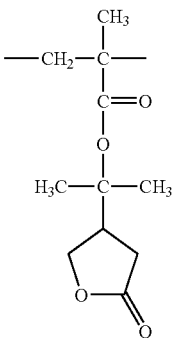
(IV-8)

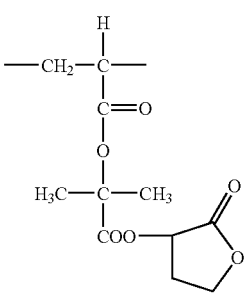
(IV-9)

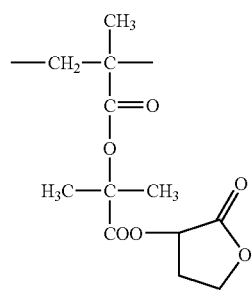
(IV-10)
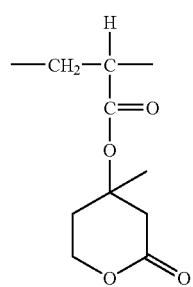
(IV-11)
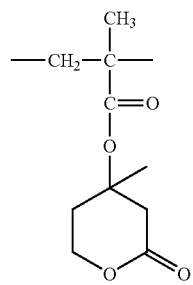
(IV-12)
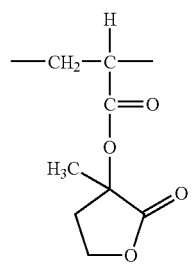
(IV-13)
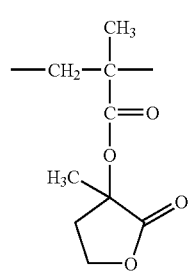
(IV-14)
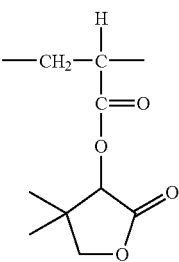
(IV-15)
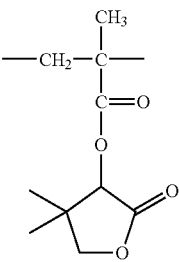
(IV-16)
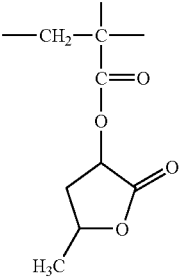
(IV-17)
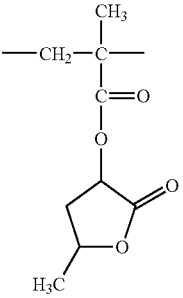
(IV-18)
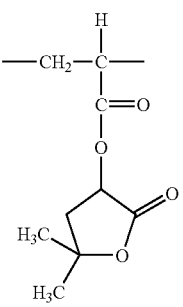
(IV-19)

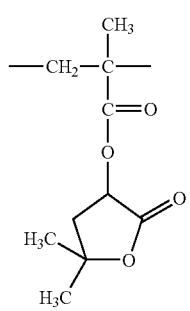
(IV-20)
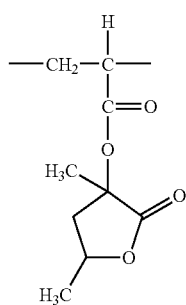
(IV-21)
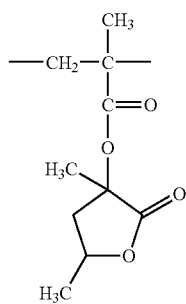
(IV-22)
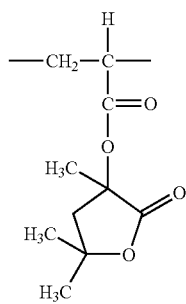
(IV-23)
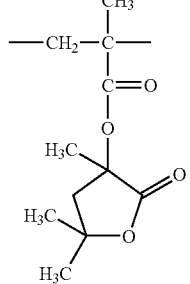
(IV-24)
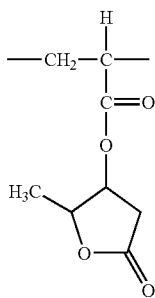
(IV-25)
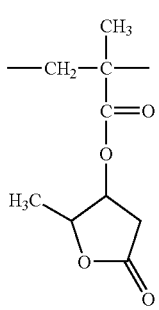
(IV-26)
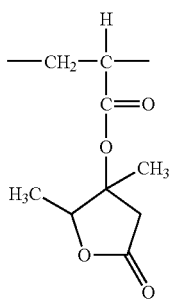
(IV-27)
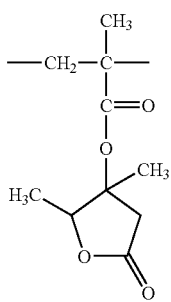
(IV-28)
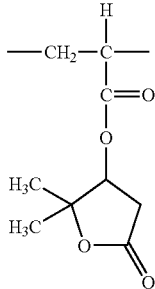
(IV-29)

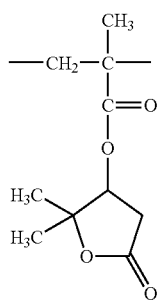 (IV-30)

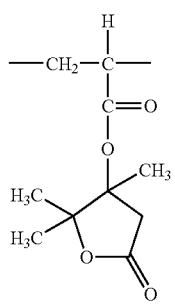 (IV-31)

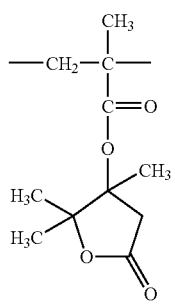 (IV-32)

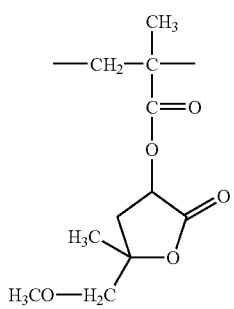 (IV-33)

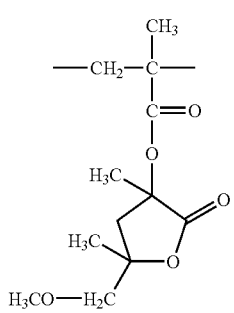 (IV-34)

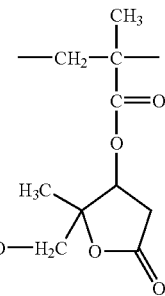 (IV-35)

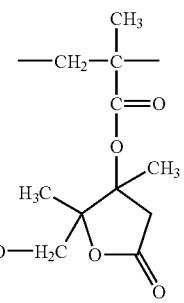 (IV-36)

Among these specific examples of formula (IV), preferred are (IV-17) to (IV-36) in view of better exposure margin.

Among these structures of formula (IV), more preferred are those having an acrylate structure in view of good edge roughness.

The acid decomposable resin for use in the present invention may further contain a repeating unit having a group represented by any one of the following formulae (V-1) to (V-4):

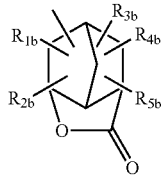 (V-1)

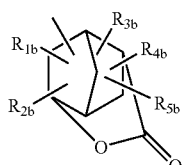 (V-2)

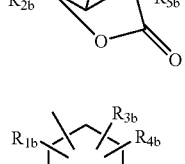 (V-3)

-continued

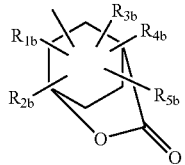
(V-4)

wherein $R_{1b}$ to $R_{5b}$ each independently represents a hydrogen atom or an alkyl, cycloalkyl or alkenyl group which may have a substituent, and two of $R_{1b}$ to $R_{5b}$ may combine to form a ring.

In formulae (V-1) to (V-4), examples of the alkyl group for $R_{1b}$ to $R_{5b}$ include a linear or branched alkyl group which may have a substituent.

The linear or branched alkyl group is preferably a linear or branched alkyl group having from 1 to 12 carbon atoms, more preferably a linear or branched alkyl group having from 1 to 10 carbon atoms, still more preferably a methyl group, an ethyl group, a propyl group, an isopropyl group, an n-butyl group, an isobutyl group, a sec-butyl group, a tert-butyl group, a pentyl group, a hexyl group, a heptyl group, an octyl group, a nonyl group or a decyl group.

The cycloalkyl group for $R_{1b}$ to $R_{5b}$ is preferably a cycloalkyl group having from 3 to 8 carbon atoms, such as cyclopropyl group, cyclopentyl group, cyclohexyl group, cycloheptyl group or cyclooctyl group.

The alkenyl group for $R_{1b}$ to $R_{5b}$ is preferably an alkenyl group having from 2 to 6 carbon atoms, such as vinyl group, propenyl group, butenyl group or hexenyl group.

Examples of the ring formed by the combining of two of $R_{1b}$ to $R_{5b}$ include 3- to 8-membered rings such as cyclopropane ring, cyclobutane ring, cyclopentane ring, cyclohexane ring and cyclooctane ring.

In formula (V-1) to (V-4), $R_{1b}$ to $R_{5b}$ each may be connected to any of the carbon atoms constituting the cyclic skeleton.

Preferred examples of the substituent which the alkyl, cycloalkyl or alkenyl group may have include an alkoxy group having from 1 to 4 carbon atoms, a halogen atom (e.g., fluorine, chlorine, bromine, iodine), an acyl group having from 2 to 5 carbon atoms, an acyloxy group having from 2 to 5 carbon atoms, a cyano group, a hydroxyl group, a carboxy group, an alkoxycarbonyl group having from 2 to 5 carbon atoms and a nitro group.

Examples of the repeating unit having a group represented by any one of formulae (V-1) to (V-4) include the repeating unit represented by the following formula (AI):

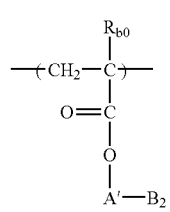
(AI)

In formula (AI), $R_{b0}$ represents a hydrogen atom, a halogen atom or a substituted or unsubstituted alkyl group having from 1 to 4 carbon atoms. Examples of the substituent which the alkyl group for $R_{b0}$ may have include those described above as preferred examples of the substituent which the alkyl group for $R_{1b}$ in formulae (V-1) to (V-4) may have.

Examples of the halogen atom for $R_{b0}$ include a fluorine atom, a chlorine atom, a bromine atom and an iodine atom. $R_{b0}$ is preferably a hydrogen atom.

A' represents a single bond, an ether group, an ester group, a carbonyl group, an alkylene group or a divalent group comprising a combination thereof.

$B_2$ represents a group represented by any one of formulae (V-1) to (V-4). Examples of the divalent group for A' include the groups represented by the following formulae:

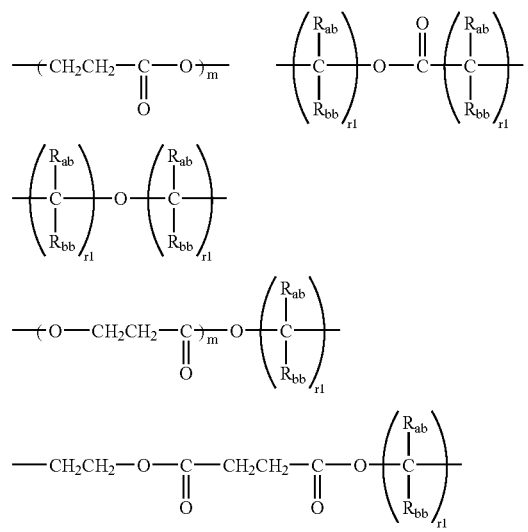

In these formulae, Rab and Rbb, which may be the same or different, each represents a hydrogen atom, an alkyl group, a substituted alkyl group, a halogen atom, a hydroxyl group or an alkoxy group.

The alkyl group is preferably a lower alkyl group such as methyl group, ethyl group, propyl group, isopropyl group or butyl group, more preferably a methyl group, an ethyl group, a propyl group or an isopropyl group. Examples of the substituent of the substituted alkyl group include a hydroxyl group, a halogen atom and an alkoxy group having from 1 to 4 carbon atoms.

Examples of the alkoxy group include an alkoxy group having from 1 to 4 carbon atoms such as methoxy group, ethoxy group, propoxy group and butoxy group. Examples of the halogen atom include a chlorine atom, a bromine atom, a fluorine atom and an iodine atom. r1 represents an integer of 1 to 10, preferably 1 to 4. m1 represents an integer of 1 to 3, preferably 1 or 2.

Specific examples of the repeating unit represented by formula (AI) are set forth below, however, the present invention is not limited thereto.

(AI-1)
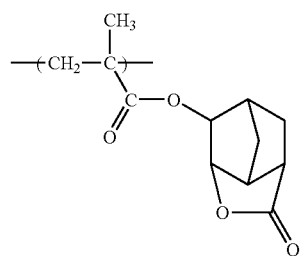
(AI-2)
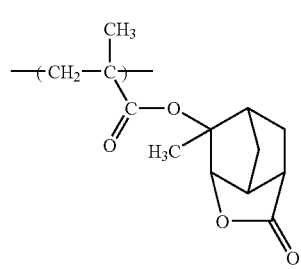
(AI-3)
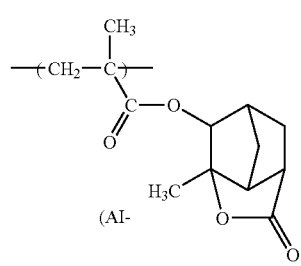
(AI-4)
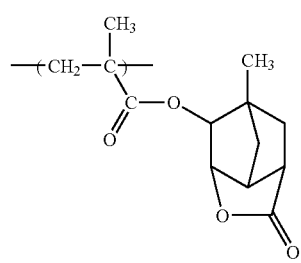
(AI-5)
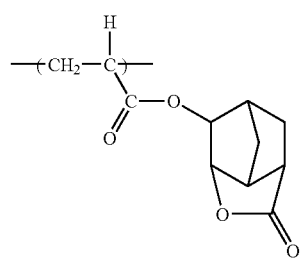
(AI-6)
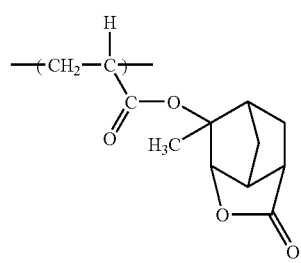
-continued
(AI-7)
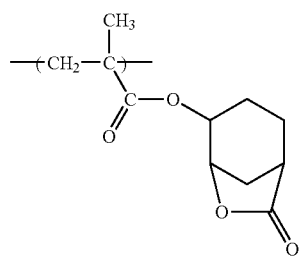
(AI-8)
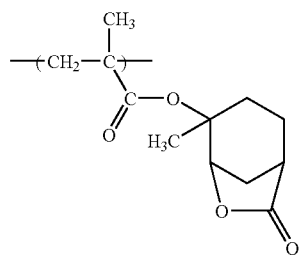
(AI-9)
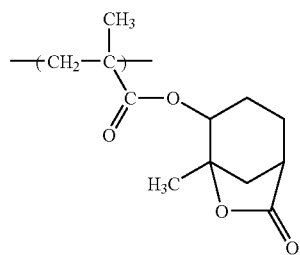
(AI-10)
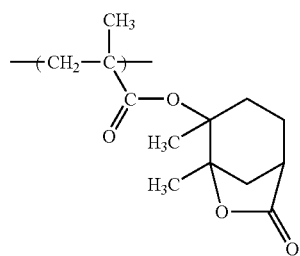
(AI-11)
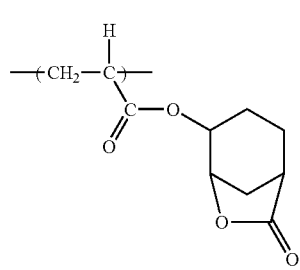
(AI-12)
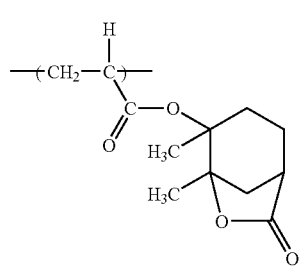

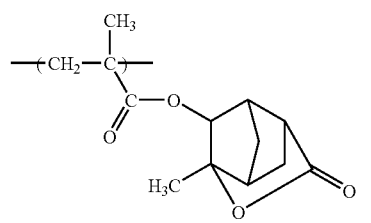
(AI-13)
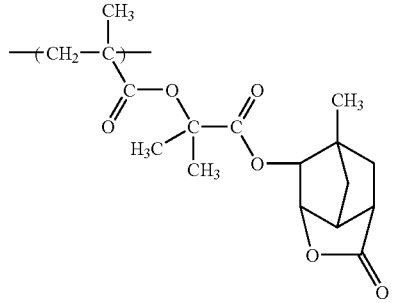
(AI-18)
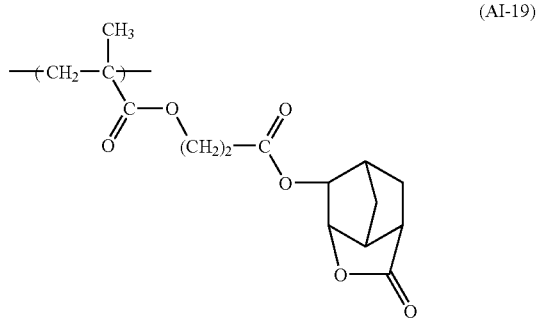
(AI-19), (AI-20), (AI-21), (AI-22)
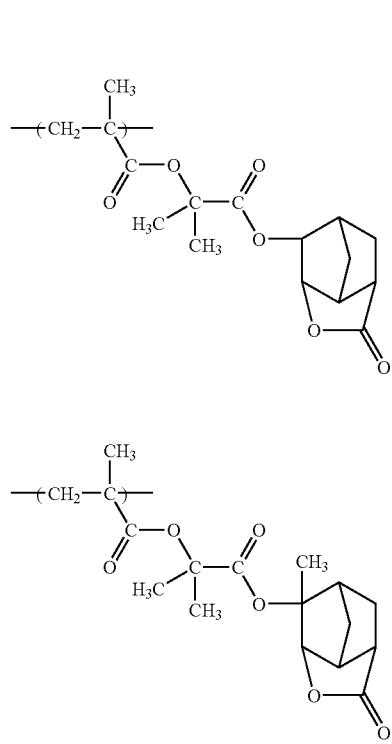
(AI-14), (AI-15), (AI-16)
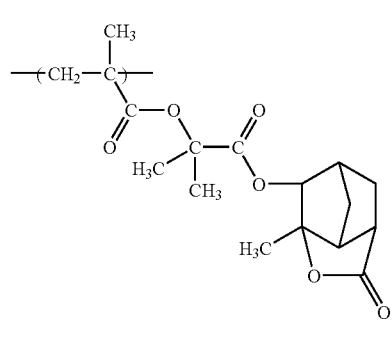
(AI-17)

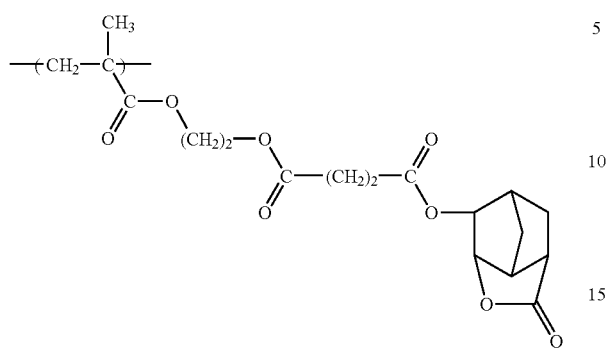
(AI-23)
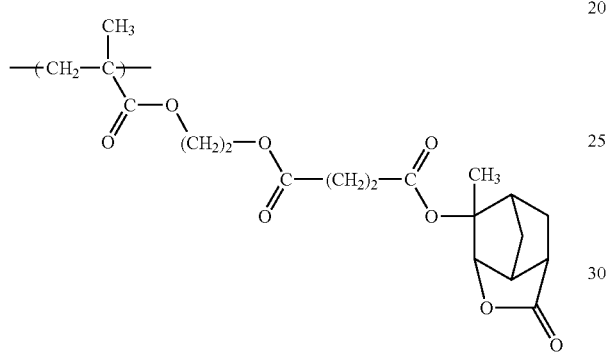
(AI-24)
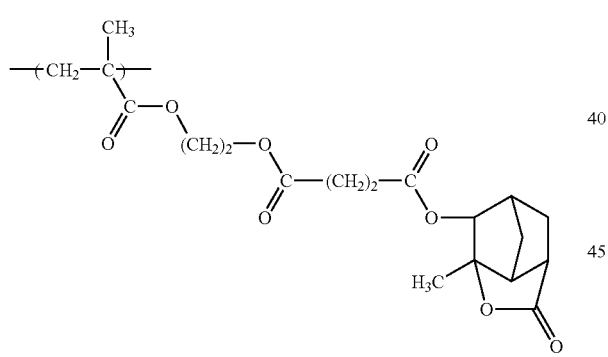
(AI-25)
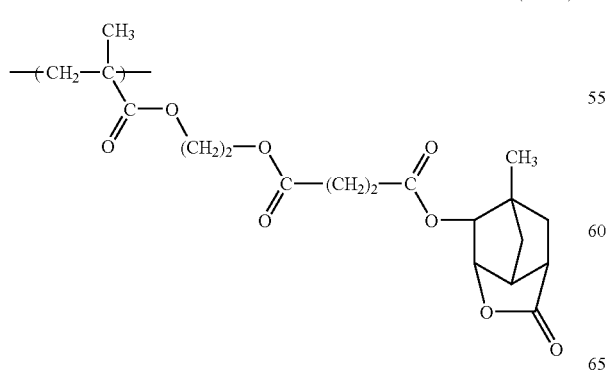
(AI-26)
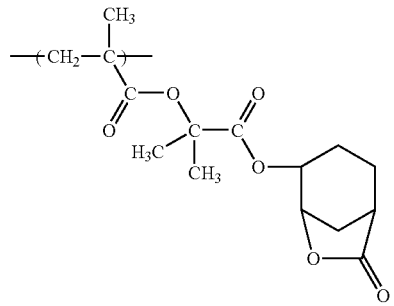
(AI-27)
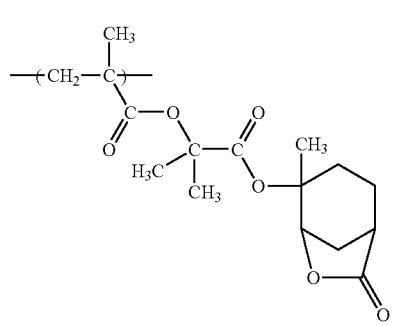
(AI-28)
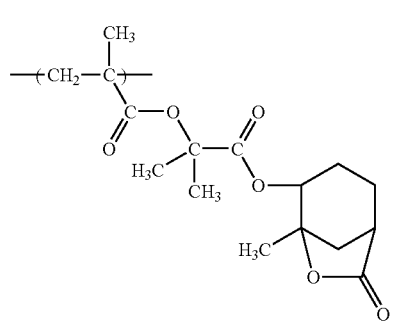
(AI-29)
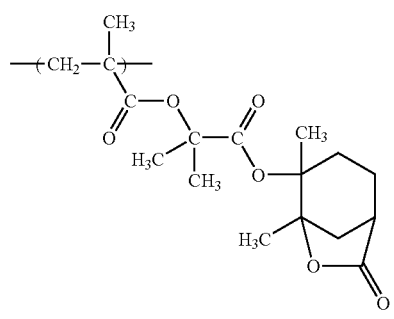
(AI-30)
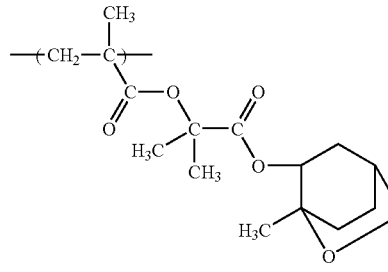
(AI-31)

(AI-32)
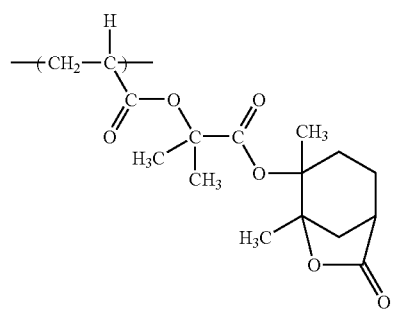
(AI-33)
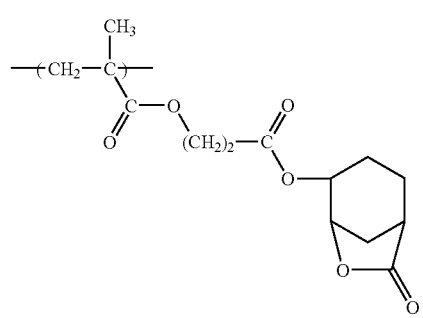
(AI-34)
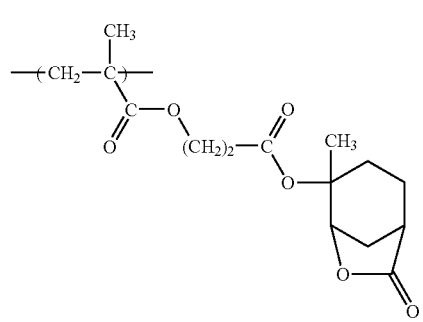
(AI-35)
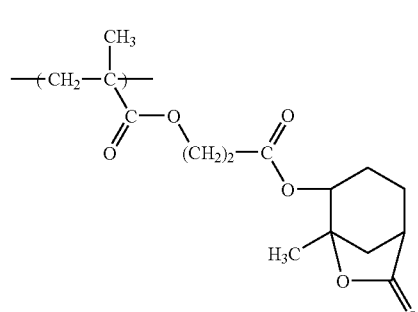
(AI-36)
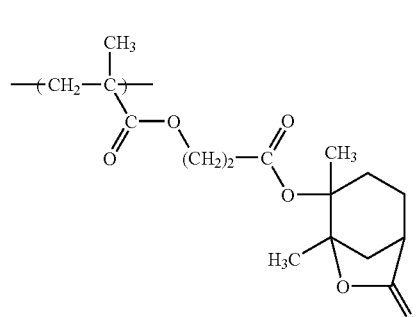
(AI-37)
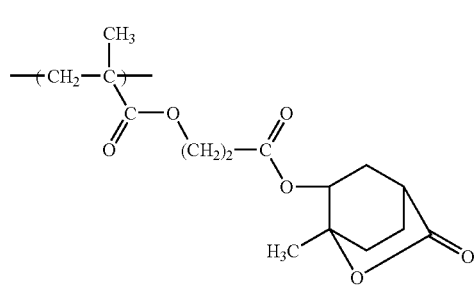
(AI-38)
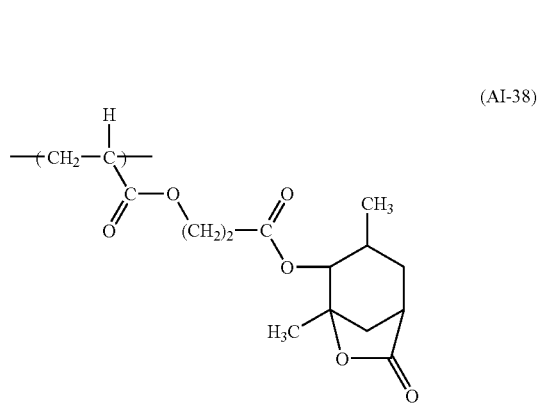
(AI-39)
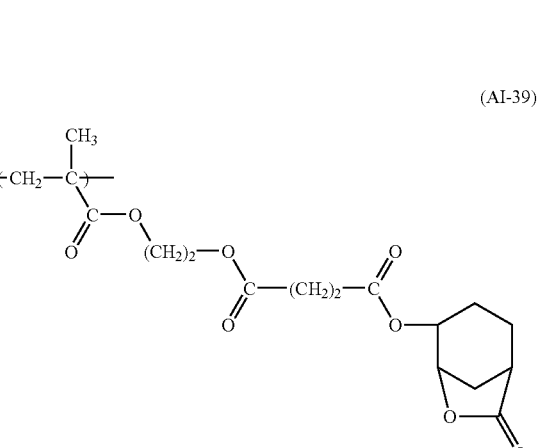
(AI-40)
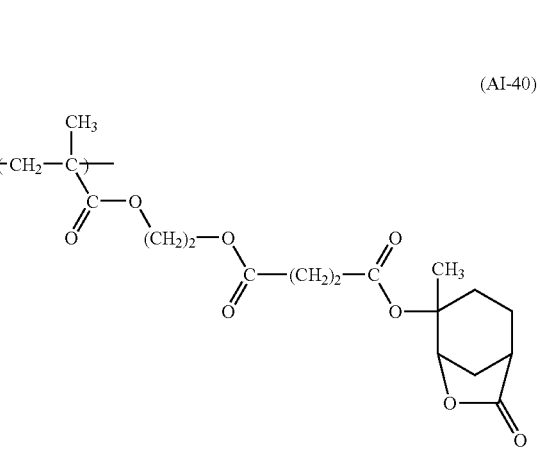

-continued (AI-41)
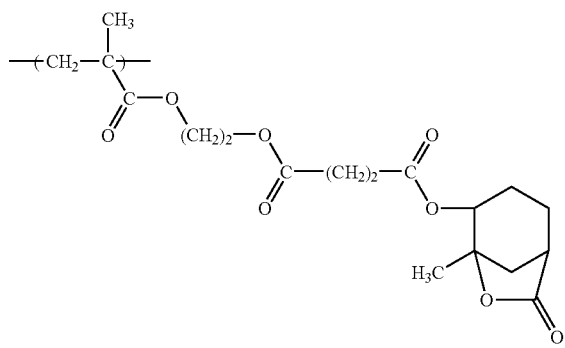

(AI-42)
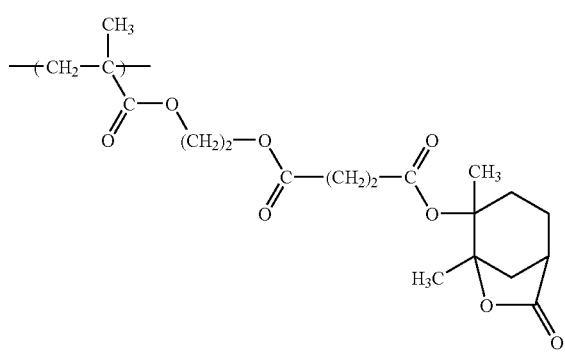

(AI-43)
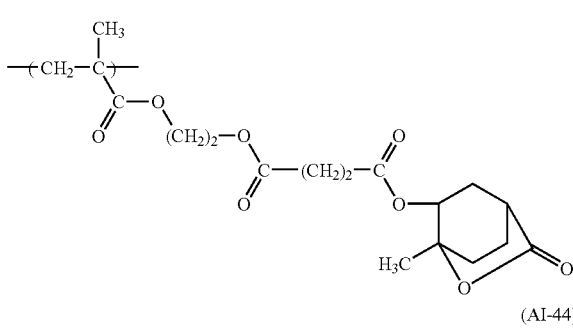

(AI-44)
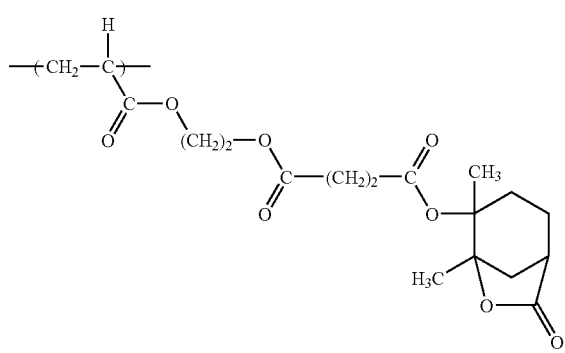

The acid decomposable resin for use in the present invention may further contain a repeating unit represented by the following formula (VI):

(VI)
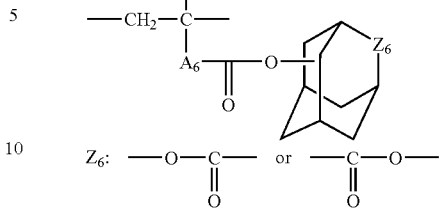

$Z_6$: —O—C(=O)—  or  —C(=O)—O—

In formula (VI), $A_6$ represents a single bond or a sole group or a combination of two or more groups, selected from the group consisting of an alkylene group, a cycloalkylene group, an ether group, a thioether group, a carbonyl group and an ester group.

$R_{6a}$ represents a hydrogen atom, an alkyl group having from 1 to 4 carbon atoms, a cyano group or a halogen atom.

Examples of the alkylene group for $A_6$ in formula (VI) include the group represented by the following formula:

—[C(Rnf)(Rng)]r—

In the formula, Rnf and Rng, which may be the same or different, each represents a hydrogen atom, an alkyl group, a substituted alkyl group, a halogen atom, a hydroxyl group or an alkoxy group. The alkyl group is preferably a lower alkyl group such as methyl group, ethyl group, propyl group, isopropyl group and butyl group, more preferably a methyl group, an ethyl group, a propyl group or an isopropyl group. Examples of the substituent of the substituted alkyl group include a hydroxyl group, a halogen atom and an alkoxy group. Examples of the alkoxy group include an alkoxy group having from 1 to 4 carbon atoms, such as methoxy group, ethoxy group, propoxy group and butoxy group. Examples of the halogen atom include a chlorine atom, a bromine atom, a fluorine atom and an iodine atom. r is an integer of 1 to 10.

Examples of the cycloalkylene group for $A_6$ in formula (VI) include a cycloalkylene group having from 3 to 10 carbon atoms such as cyclopentylene group, cyclohexylene group and cyclooctylene group.

The bridged alicyclic ring including $Z_6$ may have a substituent. Examples of the substituent include a halogen atom, an alkoxy group (preferably having from 1 to 4 carbon atoms), an alkoxycarbonyl group (preferably having from 1 to 5 carbon atoms), an acyl group (e.g., formyl group, benzoyl group), an acyloxy group (e.g., propylcarbonyloxy group, benzoyloxy group), an alkyl group (preferably having from 1 to 4 carbon atoms), a carboxyl group, a hydroxyl group and an alkylsulfonylsulfamoyl group (e.g., —CONHSO$_2$CH$_3$). The alkyl group as the substituent may be further substituted, for example, by a hydroxyl group, a halogen atom or an alkoxy group (preferably having from 1 to 4 carbon atoms).

In formula (VI), the oxygen atom of the ester group bonded to $A_6$ may be bonded at any position of the carbon atoms constituting the bridged alicyclic ring structure including $Z_6$.

Specific examples of the repeating unit represented by formula (VI) are set forth below, however, the present invention is not limited thereto.

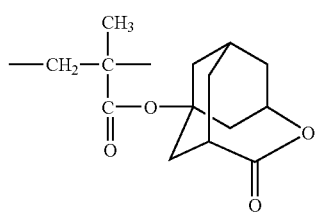
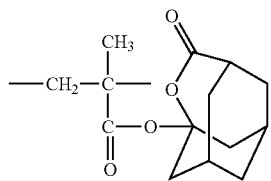
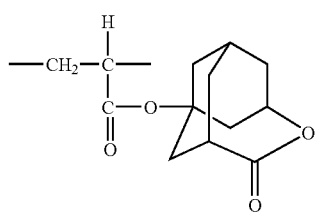
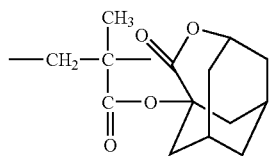
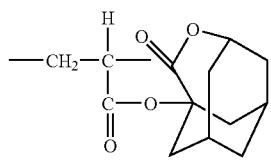
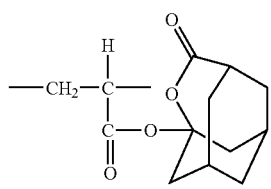
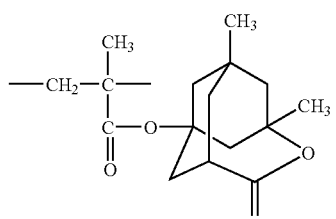
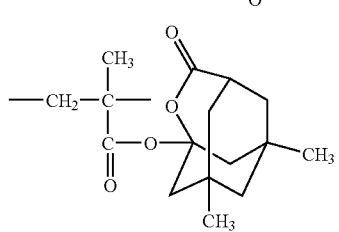
-continued
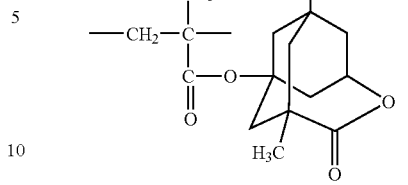
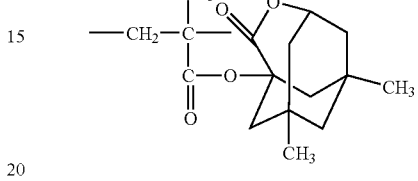
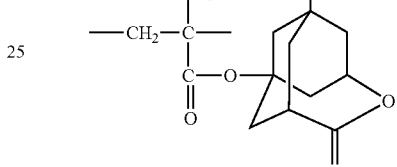
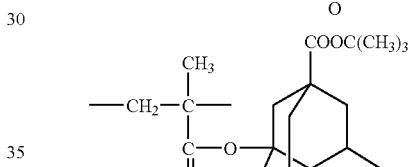
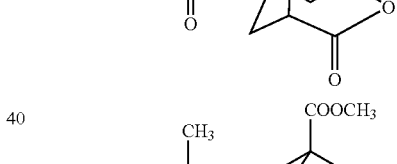
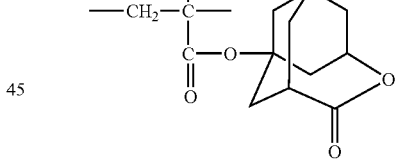
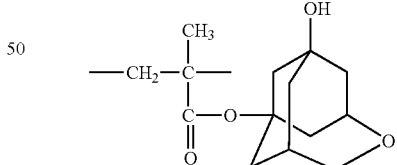
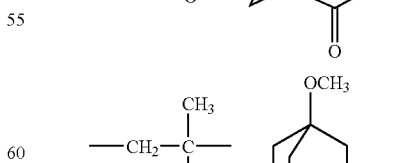

-continued

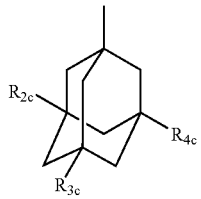

The acid decomposable resin for use in the present invention may further contain a repeating unit having a group represented by the following formula (VII):

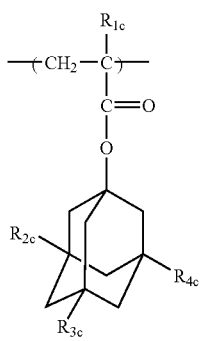
(VII)

wherein $R_{2c}$ to $R_{4c}$ each independently represents a hydrogen atom or a hydroxyl group, provided that at least one of $R_{2c}$ to $R_{4c}$ represents a hydroxyl group.

The group represented by formula (VII) is preferably a dihydroxy form or a monohydroxy form, more preferably a dihydroxy form.

Examples of the repeating unit having a group represented by formula (VII) include the repeating unit represented by the following formula (AII):

(AII)

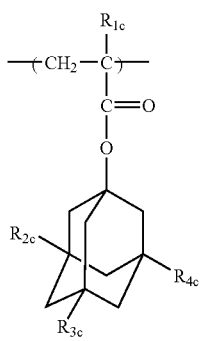

wherein $R_{1c}$ represents a hydrogen atom or a methyl group and $R_{2c}$ to $R_{4c}$ each independently represents a hydrogen atom or a hydroxyl group, provided that at least one of $R_{2c}$ to $R_{4c}$ represents a hydroxyl group.

Specific examples of the repeating unit having a structure represented by formula (AII) are set forth below, however, the present invention is not limited thereto.

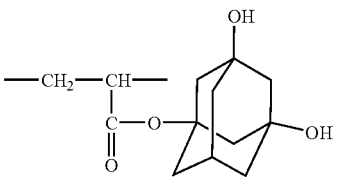
(1)

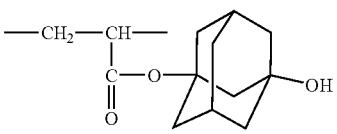
(2)

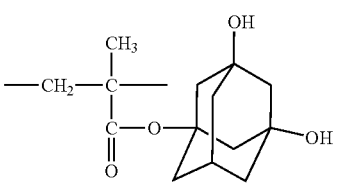
(3)

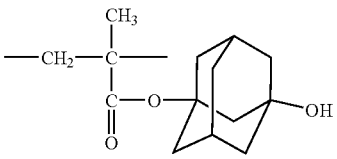
(4)

The acid decomposable resin (A) or the acid decomposable resins (Aa) and (Ab) may contain, in addition to the above-described repeating structural units, various repeating structural units for the purpose of controlling the dry etching resistance, suitability for standard developer, adhesion to substrate, resist profile and properties generally required of the resist, such as resolution, heat resistance and sensitivity.

Examples of such repeating structural units include the repeating structural units corresponding to the monomers described below, however, the present invention is not limited thereto.

By containing these repeating structural units, the performance required of the acid decomposable resin, particularly, (1) solubility in the coating solvent,
(2) film-forming property (glass transition point),
(3) alkali developability,
(4) film thickness loss (selection of hydrophilic, hydrophobic or alkali-soluble group),
(5) adhesion of unexposed area to substrate,
(6) dry etching resistance and the like can be delicately controlled.

Examples of the monomer include compounds having one addition polymerizable unsaturated bond selected from acrylic acid esters, methacrylic acid esters, acrylamides, methacrylamides, allyl compounds, vinyl ethers and vinyl esters.

Specific examples thereof include the following monomers.

Acrylic Acid Esters (Preferably Alkyl Acrylate with the Alkyl Group having from 1 to 10 Carbon Atoms):

methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetra-hydrofurfuryl acrylate, etc.

Methacrylic acid esters (preferably alkyl methacrylate with the alkyl group having from 1 to 10 carbon atoms):

methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate, etc.

Acrylamides:

acrylamide, N-alkylacrylamide (the alkyl group is an alkyl group having from 1 to 10 carbon atoms, such as methyl group, ethyl group, propyl group, butyl group, tert-butyl group, heptyl group, octyl group, cyclohexyl group and hydroxyethyl group), N,N-dialkylacrylamide (the alkyl group is an alkyl group having from 1 to 10 carbon atoms, such as methyl group, ethyl group, butyl group, isobutyl group, ethylhexyl group and cyclohexyl group), N-hydroxyethyl-N-methylacrylamide, N-2-acetamidoethyl-N-acetylacrylamide, etc.

Methacrylamides:

methacrylamide, N-alkylmethacrylamide (the alkyl group is an alkyl group having from 1 to 10 carbon atoms, such as methyl group, ethyl group, tert-butyl group, ethylhexyl group, hydroxyethyl group and cyclohexyl group), N,N-dialkylmethacrylamide (the alkyl group is, for example, an ethyl group, a propyl group or a butyl group), N-hydroxyethyl-N-methylmethacrylamide, etc.

Allyl Compounds:

allyl ester (e.g., allyl acetate, allyl caproate, allyl caprate, allyl laurate, allyl palmitate, allyl stearate, allyl benzoate, allyl acetoacetate, allyl lactate), allyloxy ethanol, etc.

Vinyl Ethers:

alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether), etc.

Vinyl Esters:

vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-β-phenylbutyrate, vinylcyclohexyl carboxylate, etc.

Dialkyl Itaconates:

dimethyl itaconate, diethyl itaconate, dibutyl itaconate, etc.

Dialkyl Esters and Monoalkyl Esters of Fumaric Acid:

dibutyl fumarate, etc.

In addition, crotonic acid, itaconic acid, maleic anhydride, maleimide, acrylonitrile, methacrylonitrile, maleylonitrile and the like may be used.

Other than these, an addition-polymerizable unsaturated compound copolymerizable with the monomer corresponding to the above-described various repeating structural units may be copolymerized.

In the acid decomposable resin as the component (A), the molar ratio of respective repeating structural units contained is appropriately selected for controlling the dry etching resistance, suitability for standard developer, adhesion to substrate, resist profile and properties generally required of the resist, such as resolution, heat resistance and sensitivity.

In the case where a resin containing both a repeating unit represented by formula (Ia) and a repeating unit represented by formula (Ib) is used as the acid decomposable resin (A), the total content of both the repeating unit represented by formula (Ia) and the repeating unit represented by formula (Ib), in the acid decomposable resin as the component (A) is preferably from 30 to 70 mol %, more preferably from 35 to 65 mol %, still more preferably from 40 to 60 mol %, based on all repeating structural units.

The molar ratio of the repeating unit represented by formula (Ia) to the repeating unit represented by formula (Ib) is generally from 99/1 to 1/99, preferably from 90/10 to 10/90, more preferably from 80/20 to 20/80.

In the acid decomposable resin, the content of the repeating unit having a partial structure containing an alicyclic hydrocarbon represented by formula (pIII), (pIV) or (pV) is preferably from 30 to 70 mol %, more preferably from 35 to 65 mol %, still more preferably from 40 to 60 mol %, based on all repeating structural units.

In the acid decomposable resin, the total content of the repeating units represented by formulae (IV) to (VII) is preferably from 5 to 70 mol %, more preferably from 10 to 65 mol %, still more preferably from 15 to 60 mol %, based on all repeating structural units.

In the acid decomposable resin, the content of the repeating unit having an acid decomposable group containing a repeating unit represented by formula (Ia) or (Ib) or a repeating unit having a partial structure containing an alicyclic hydrocarbon represented by formula (pIII), (pIV) or (pV) is preferably from 30 to 70 mol %, more preferably from 35 to 65 mol %, still more preferably from 40 to 60 mol %, based on all repeating structural units.

In the case where a resin (Aa) containing a repeating unit represented by formula (Ia) and a resin (Ab) containing a repeating unit represented by formula (Ib) are used in combination as the acid decomposable resin (A), the content of the repeating unit represented by formula (Ia) in the acid decomposable resin (Aa) is preferably from 30 to 70 mol %, more preferably from 35 to 65 mol %, still more preferably from 40 to 60 mol %, based on all repeating structural units.

In the acid decomposable resin (Ab), the content of the repeating unit represented by formula (Ib) is preferably from 30 to 70 mol %, more preferably from 35 to 65 mol %, still more preferably from 40 to 60 mol %, based on all repeating structural units.

In the acid decomposable resins (Aa) and (Ab), the content of the repeating unit having a partial structure containing an alicyclic hydrocarbon represented by formula (pIII), (pIV) or (pV) is preferably from 30 to 70 mol %, more preferably from 35 to 65 mol %, still more preferably from 40 to 60 mol %, based on all repeating structural units.

In the acid decomposable resins (Aa) and (Ab), the total content of the repeating units represented by formulae (IV) to (VII) is preferably from 5 to 70 mol %, more preferably from 10 to 65 mol %, still more preferably from 15 to 60 mol %, based on all repeating structural units.

In the acid decomposable resins (Aa) and (Ab), the content of the repeating unit having an acid decomposable group containing a repeating unit represented by formula (Ia) or (Ib) or a repeating unit having a partial structure containing an alicyclic hydrocarbon represented by formula (pIII), (pIV) or (pV) is preferably from 30 to 70 mol %, more preferably from 35 to 65 mol %, still more preferably from 40 to 60 mol %, based on all repeating structural units.

The weight ratio of the acid decomposable resin (Aa) to the acid decomposable resin (Ab) is generally from 99:1 to 1:99, preferably from 90:10 to 10:90, more preferably from 80:20 to 20:80.

The amount of the acid decomposable resin as the component (A) or the total amount of the acid decomposable resins (Aa) and (Ab) is generally from 50 to 99.99 wt %, preferably from 60 to 99.97 wt %, based on all solid contents in the composition of the present invention.

The acid decomposable resin for use in the present invention can be synthesized by an ordinary method (for example, radical polymerization). In the general synthesis method, for example, monomer species are charged into a reactor all at once or on the way of reaction and dissolved, if desired, in a reaction solvent, for example, tetrahydrofuran, 1,4-dioxane, an ether such as diisopropyl ether, a ketone such as methyl ethyl ketone or methyl isobutyl ketone, an ester such as ethyl acetate, or a solvent which dissolves the composition of the present invention, such as propylene glycol monomethyl ether acetate which is described later. The obtained uniform solution is heated, if desired, in an inert gas atmosphere such as nitrogen or argon and using a commercially available radical polymerization initiator (e.g., azo-base initiator, peroxide), the polymerization is initiated. If desired, the initiator may be additionally added or may be added in parts. After the completion of reaction, the reactant is poured into a solvent and the desired polymer is recovered by a powder or solid recovery method. The reaction concentration is 20 wt % or more, preferably 30 wt % or more, more preferably 40 wt % or more. The reaction temperature is from 10 to 150° C., preferably from 30 to 120° C., more preferably from 50 to 100° C.

The weight average molecular weight of the resin for use in the present invention is preferably from 1,000 to 200,000 in terms of polystyrene by GPC method. If the weight average molecular weight is less than 1,000, the heat resistance or dry etching resistance disadvantageously decreases, whereas if it exceeds 200,000, the developability may deteriorate or due to extremely high viscosity, disadvantageous results may occur, for example, the film-forming property decreases.

When the composition of the present invention is used for exposure with ArF, the resin preferably has no aromatic ring in view of the transparency to ArF light.

Furthermore, the resin preferably has no alicyclic group on the main chain because the resolution of contact hole pattern is excellent and the defocus latitude is extremely improved.

In the positive photoresist composition for far ultraviolet exposure of the present invention, the amount of all resins for use in the present invention blended in the entire composition is preferably from 40 to 99.99 wt %, more preferably from 50 to 99.97 wt %, based on the entire resist solid content.

[2] (B) Compound capable of generating acid upon irradiation with actinic rays or radiation (photo-acid generator)

The photo-acid generator for use in the present invention may be appropriately selected from a photoinitiator for photocationic polymerization, a photoinitiator for photoradical polymerization, a photo-decoloring agent for dyes, a photo-discoloring agent, a compound capable of generating an acid upon irradiation with known light used for microresist and the like (for example, ultraviolet or far ultraviolet ray at 200 to 400 nm, preferably g line, h line, i line and a KrF excimer laser ray) or with an ArF excimer laser ray, an electron beam, an X ray, a molecular beam or an ion beam, and a mixture thereof.

Examples thereof include onium salts such as diazonium salt, ammonium salt, phosphonium salt, iodonium salt, sulfonium salt, selenonium salt and arsonium salt, organic halogen compounds, organic metals/organic halides, photo-acid generators having an o-nitrobenzyl-type protective group, compounds capable of generating a sulfonic acid upon photochemical decomposition, represented by iminosulfonate and the like, disulfone compounds, diazoketosulfone and diazosulfone compounds.

In addition, compounds where the above-described group or compound capable of generating an acid upon irradiation with light is introduced into the polymer main or side chain may also be used.

Furthermore, the compounds capable of generating an acid upon irradiation with light described, for example, in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 may also be used.

Among these compounds capable of decomposing upon irradiation with actinic rays or radiation to generate an acid, the other photo-acid generator which can be particularly effectively used in combination is described below.

(1) Oxazole derivative represented by the following formula (PAG1) and S-triazine derivative represented by formula (PAG2), each substituted by trihalomethyl group:

wherein $R^{201}$ represents a substituted or unsubstituted aryl group or a substituted or unsubstituted alkenyl group, $R^{202}$ represents a substituted or unsubstituted aryl group, a substituted or unsubstituted alkenyl group, a substituted or unsubstituted alkyl group or $-C(Y)_3$, and Y represents a chlorine atom or a bromine atom.

Specific examples thereof include the following compounds, however, the present invention is not limited thereto.

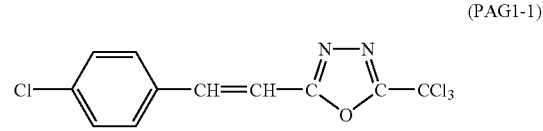

-continued
(PAG1-2)
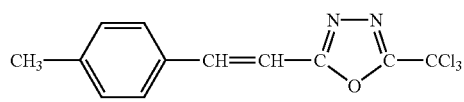
(PAG1-3)
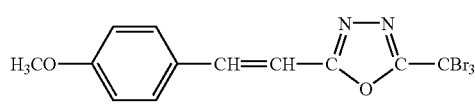
(PAG1-4)
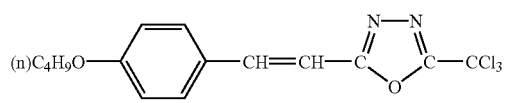
(PAG1-5)
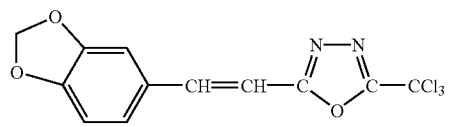
(PAG1-6)
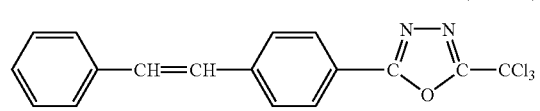
(PAG1-7)
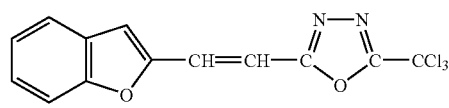
(PAG1-8)
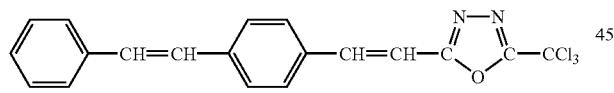
(PAG2-1)
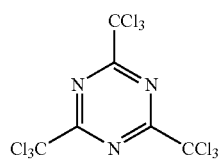
(PAG2-2)
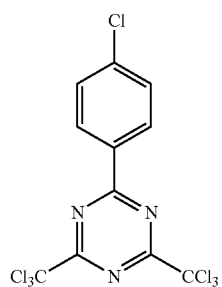
-continued
(PAG2-3)
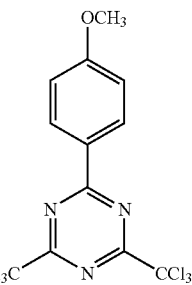
(PAG2-4)
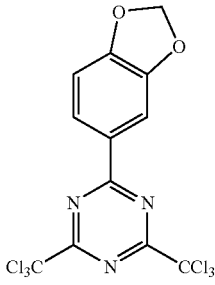
(PAG2-5)
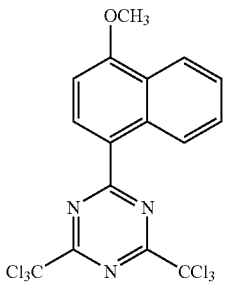
(PAG2-6)
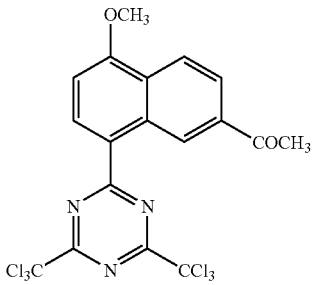
(PAG2-7)
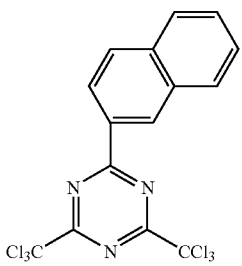

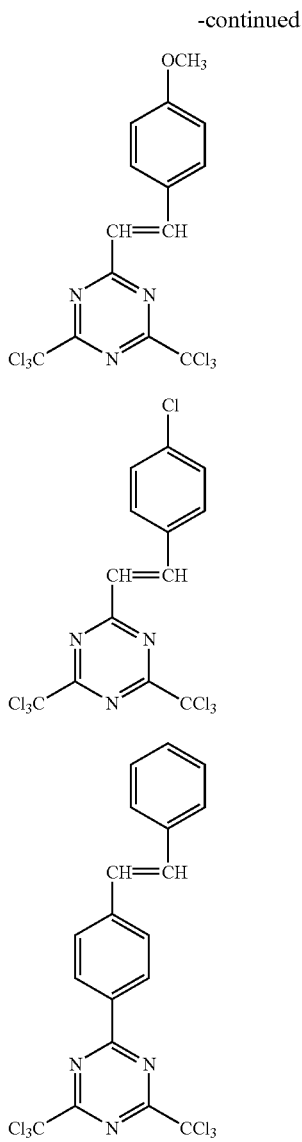

(2) Iodonium salt represented by the following formula (PAG3) and sulfonium salt represented by formula (PAG4):

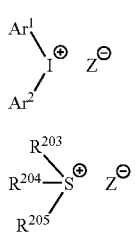

In these formulae, $Ar^1$ and $Ar^2$ each independently represents a substituted or unsubstituted aryl group.

$R^{203}$, $R^{204}$ and $R^{205}$ each independently represents a substituted or unsubstituted alkyl group or a substituted or unsubstituted aryl group.

$Z^-$ represents a counter anion and examples thereof include perfluoroalkane sulfonate anion (e.g., $BF_4^-$, $AsF_6^-$, $PF_6^-$, $SbF_6^-$, $SiF_6^{2-}$, $ClO_4^-$, $CF_3SO_3^-$), pentafluorobenzene sulfonate anion, condensed polynuclear aromatic sulfonate anion (e.g., naphthalene-1-sulfonate anion), anthraquinone sulfonate anion, and sulfonic acid group-containing dyes, however, the present invention is not limited thereto.

Two of $R^{203}$, $R^{204}$ and $R^{205}$, or $Ar^1$ and $Ar^2$ may be combined through a single bond or a substituent.

Specific examples of these onium salts include the following compounds, however, the present invention is not limited thereto.

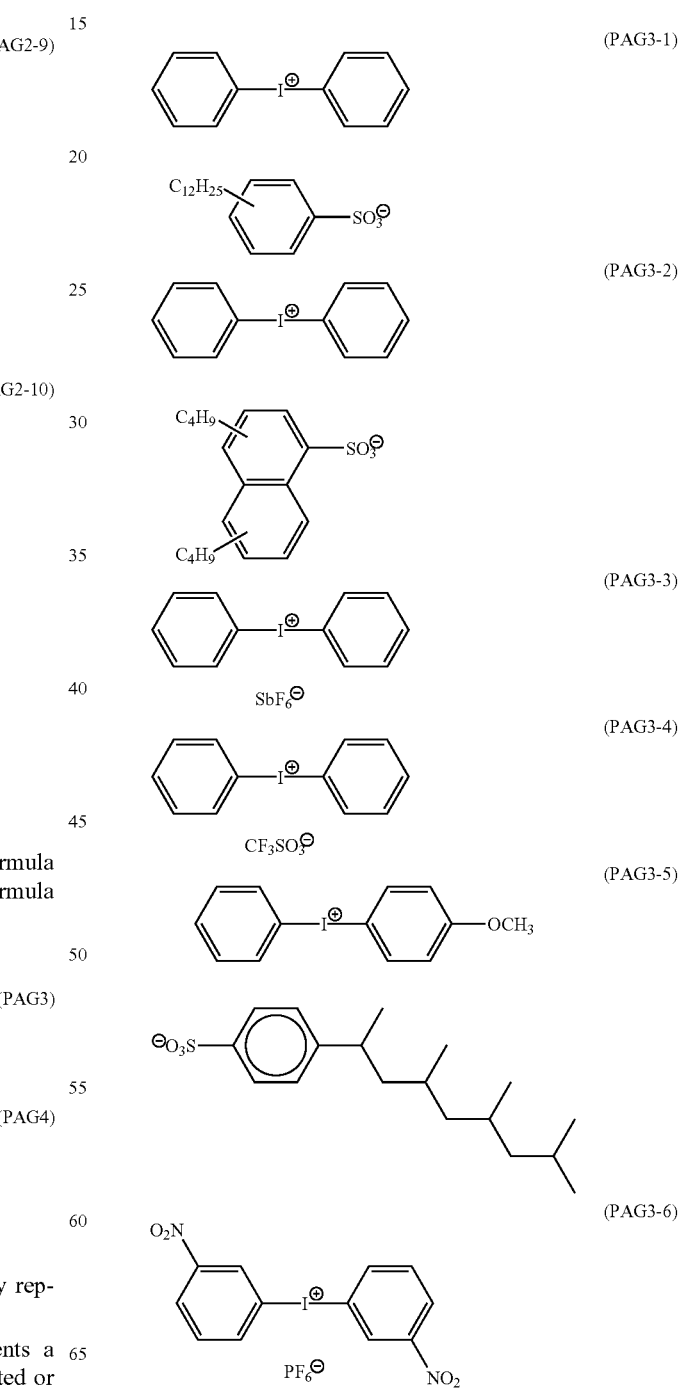

-continued (PAG3-7)

(PAG3-8)

(PAG3-9)

(PAG3-10)

(PAG3-11)

(PAG3-12)

-continued (PAG3-13)

(PAG3-14)

(PAG3-15)

(PAG3-16)

(PAG3-17)

(PAG3-18)

(PAG3-19)

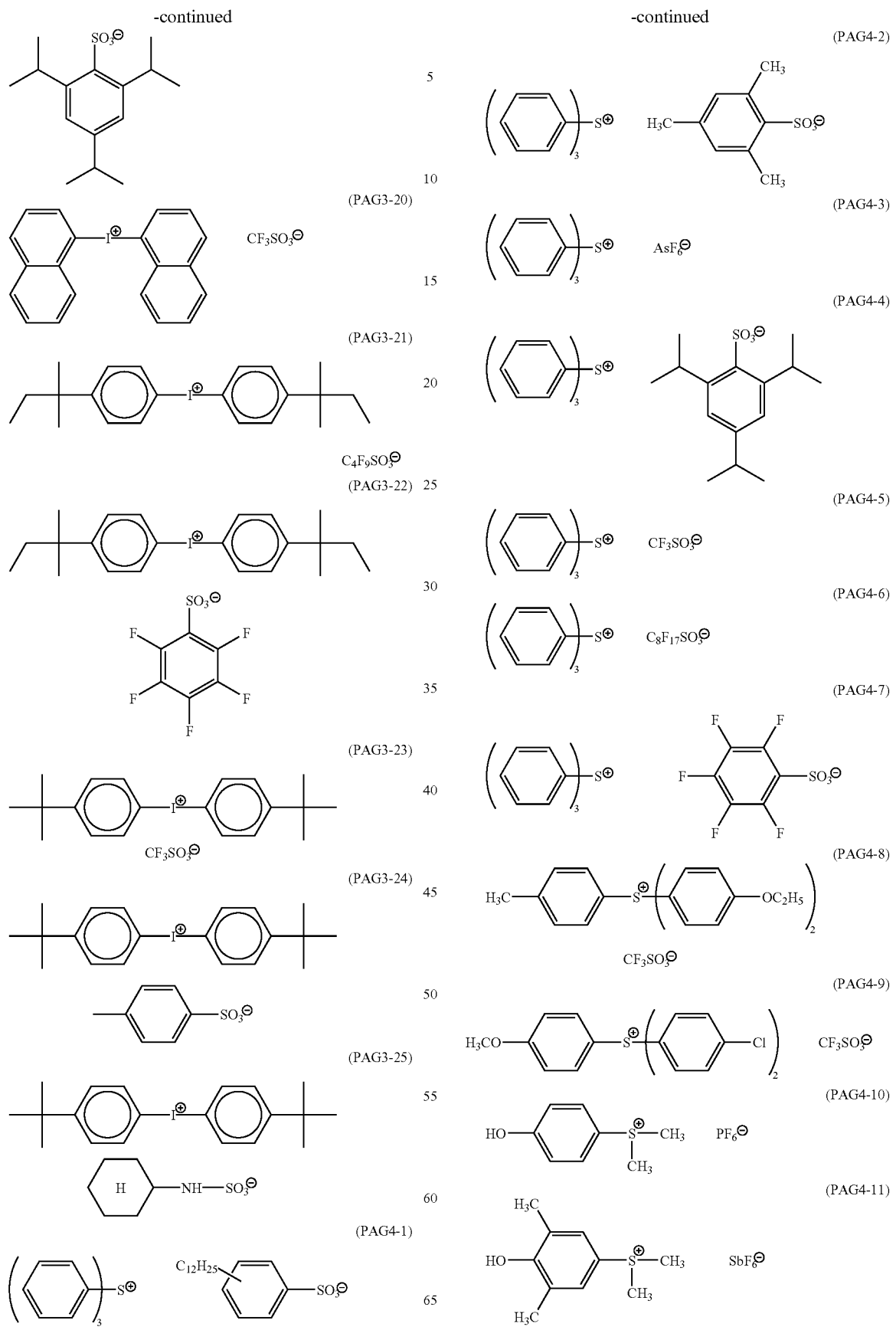

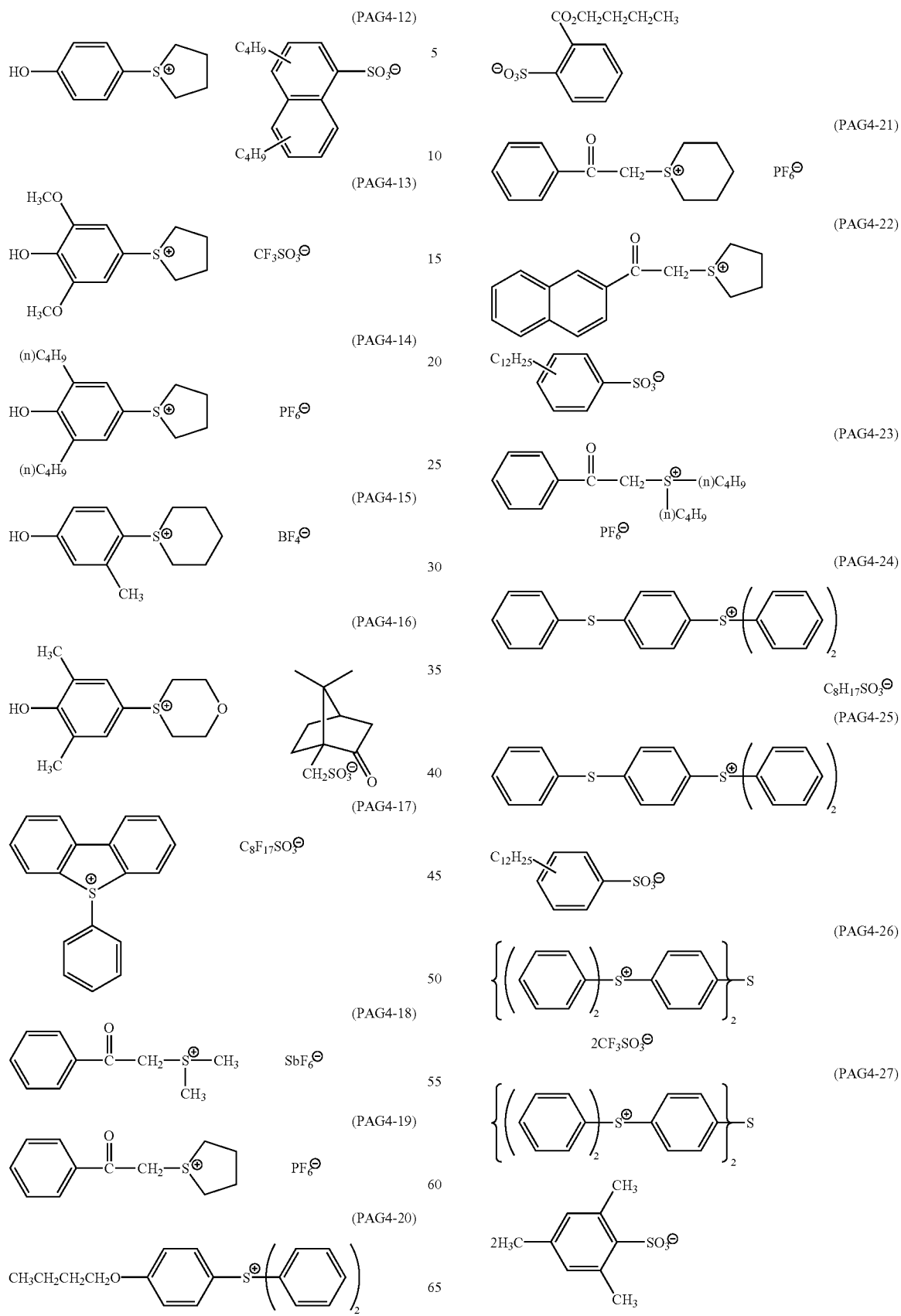

-continued
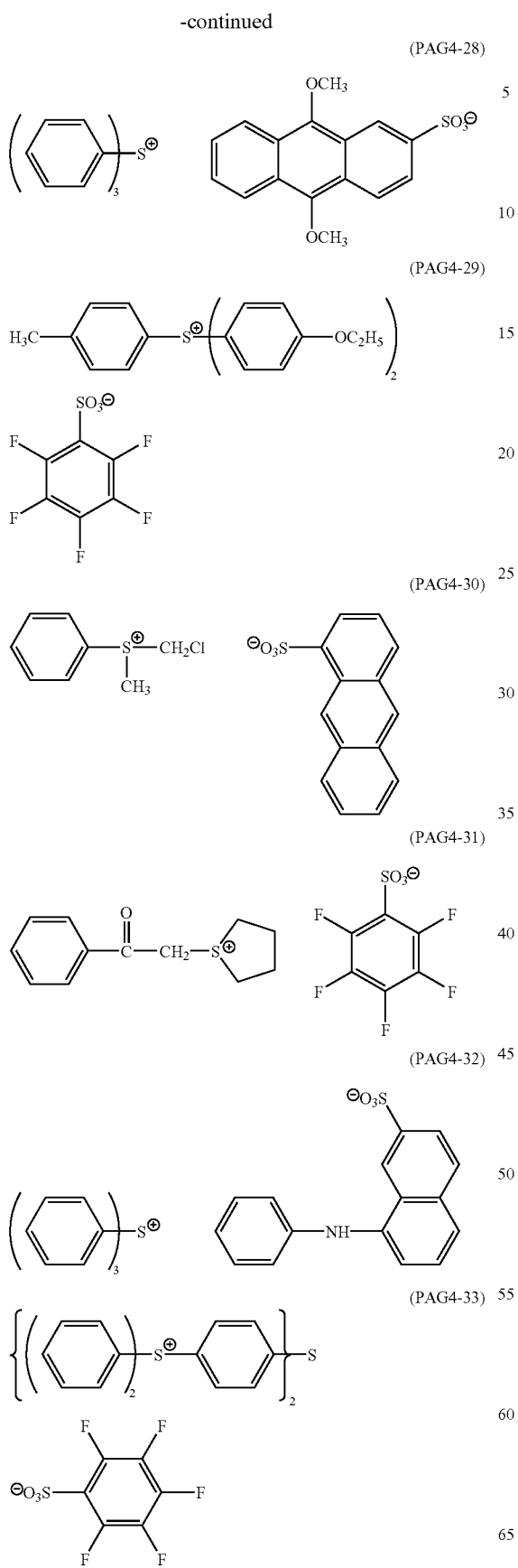
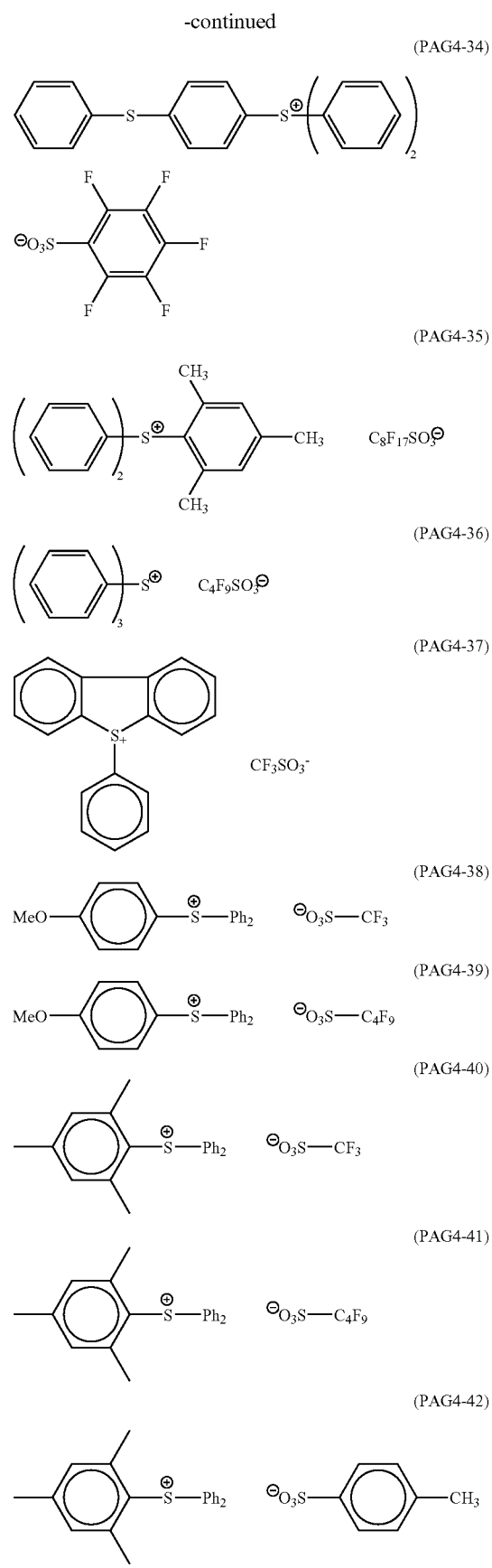

In these formulae, Ph represents a phenyl group.

The onium salts represented by formulae (PAG3) and (PAG4) are known and can be synthesized by the method described, for example, in U.S. Pat. Nos. 2,807,648 and 4,247,473, and JP-A-53-101331.

(3) Disulfone derivative represented by the following formula (PAG5) and iminosulfonate derivative represented by formula (PAG6):

$$Ar^3—SO_2—SO_2—Ar^4 \quad \text{(PAG5)}$$

(PAG6)

wherein $Ar^3$ and $Ar^4$ each independently represents a substituted or unsubstituted aryl group, $R^{206}$ represents a substituted or unsubstituted alkyl group or a substituted or unsubstituted aryl group, and A represents a substituted or unsubstituted alkylene group, a substituted or unsubstituted alkenylene group or a substituted or unsubstituted arylene group.

Specific examples thereof include the following compounds, however, the present invention is not limited thereto.

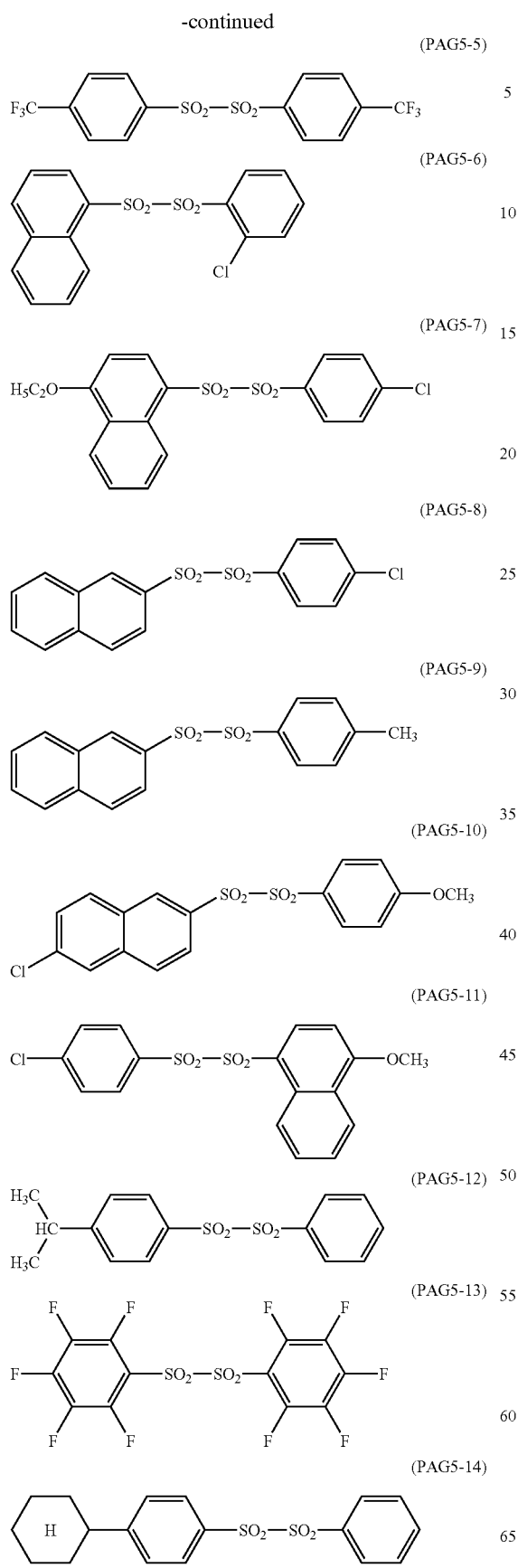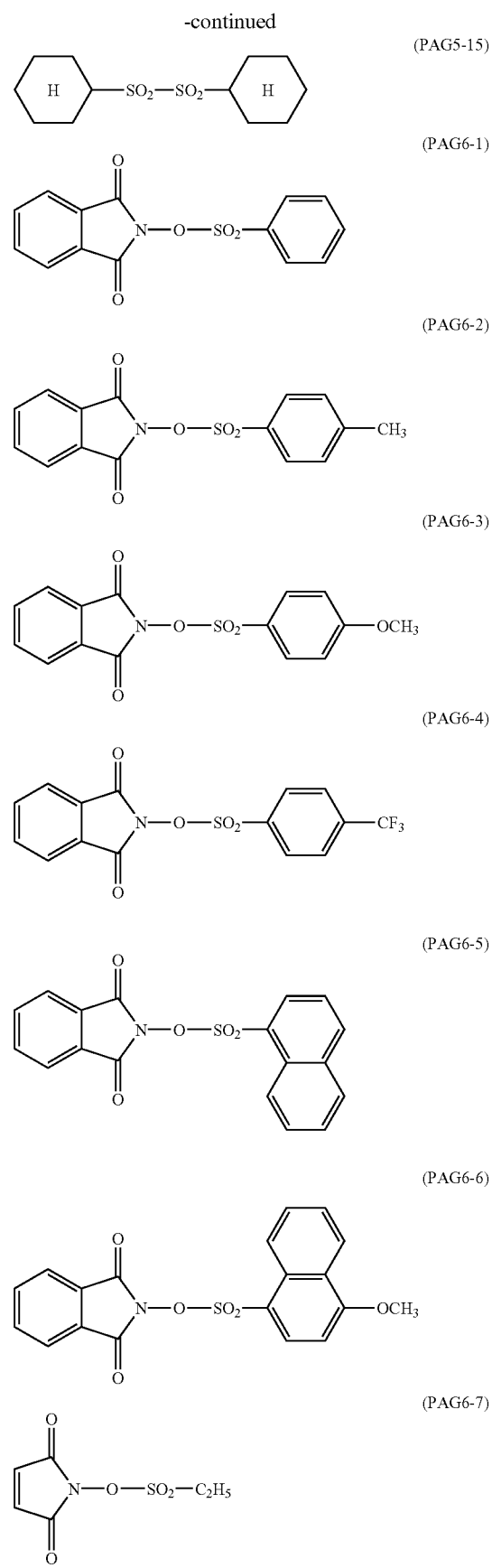

-continued
(PAG6-8)
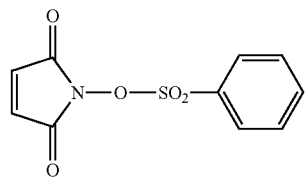
(PAG6-9)
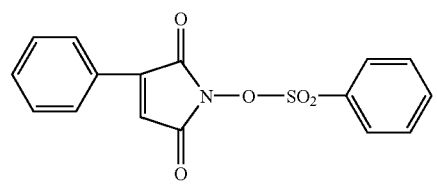
(PAG6-10)
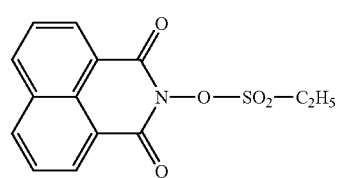
(PAG6-11)
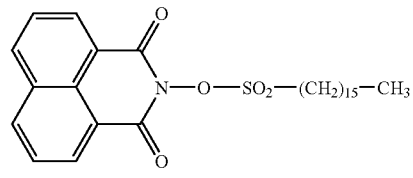
(PAG6-12)
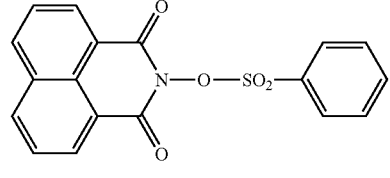
(PAG6-13)
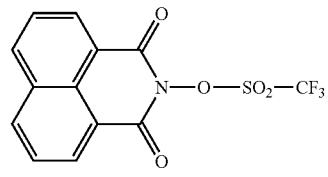
(PAG6-14)
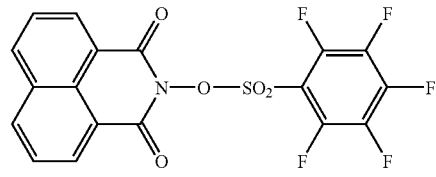
(PAG6-15)
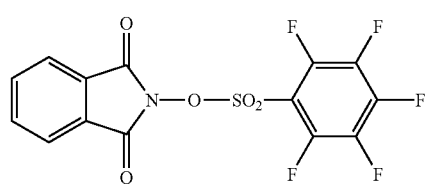
-continued
(PAG6-16)
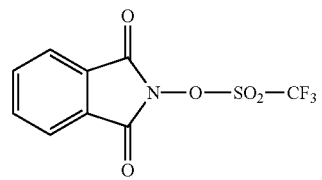
(PAG6-17)
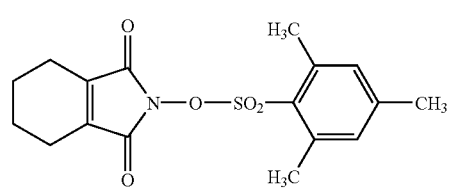
(PAG6-18)
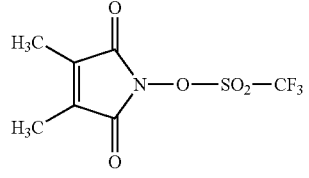
(PAG6-19)
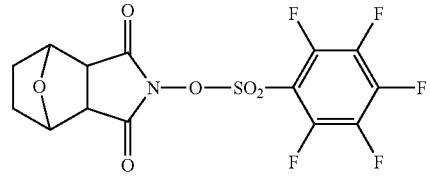
(PAG6-20)
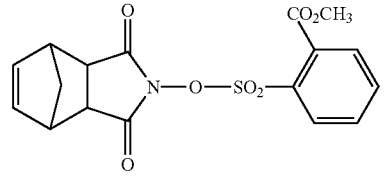
(PAG6-21)
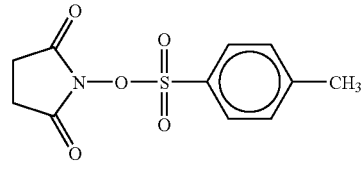
(PAG6-22)
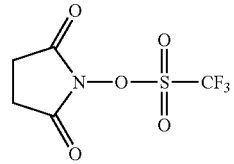
(PAG6-23)
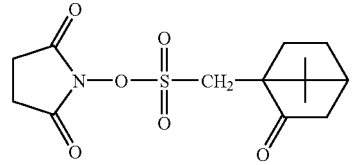

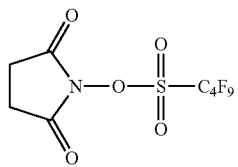
(PAG6-24)
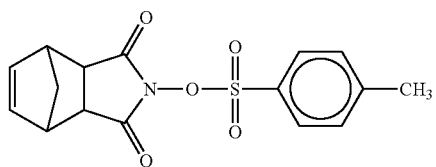
(PAG6-25)
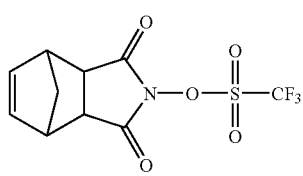
(PAG6-26)
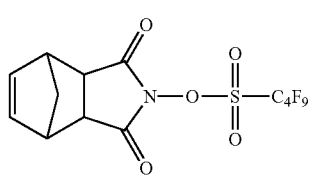
(PAG6-27)
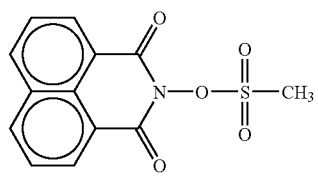
(PAG6-28)
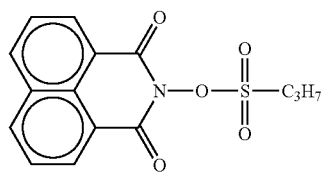
(PAG6-29)
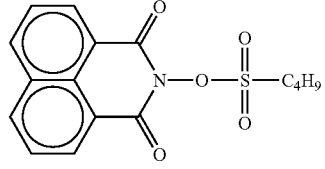
(PAG6-30)
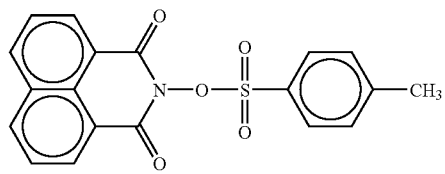
(PAG6-31)
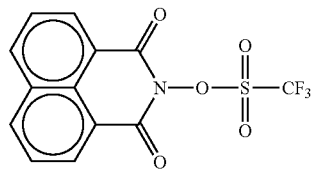
(PAG6-32)
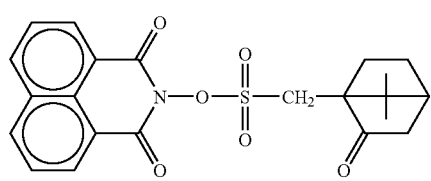
(PAG6-33)
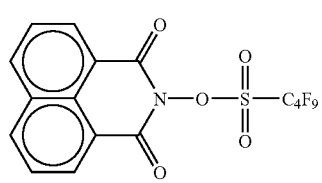
(PAG6-34)
(4) Diazodisulfone derivative represented by the following formula (PAG7)
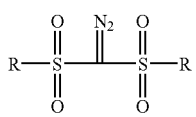
(PAG7)
wherein R represents a linear, branched or cyclic alkyl group or aryl group which may be substituted.
Specific examples thereof include the following compounds, however, the present invention is not limited thereto.
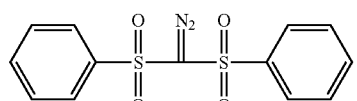
(PAG7-1)
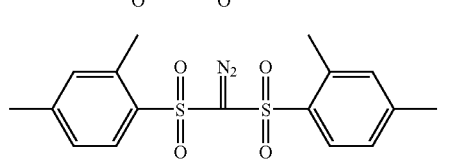
(PAG7-2)
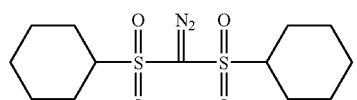
(PAG7-3)
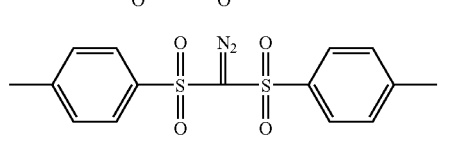
(PAG7-4)

-continued

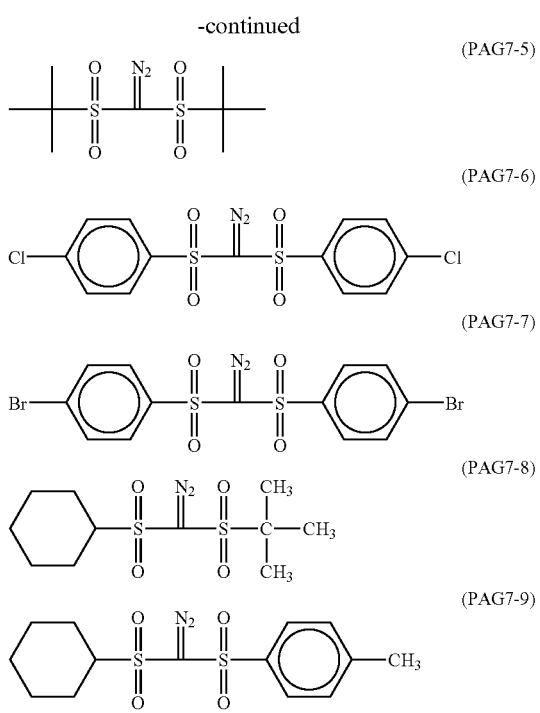

(PAG7-5)

(PAG7-6)

(PAG7-7)

(PAG7-8)

(PAG7-9)

The amount of the photo-acid generator added is usually from 0.001 to 30 wt %, preferably from 0.3 to 20 wt %, more preferably from 0.5 to 10 wt %, based on the solid content in the composition. If the amount of the photo-acid generator added is less than 0.001 wt %, the sensitivity lowers, whereas if the amount added exceeds 30 wt %, the light absorption of the resist becomes excessively high to cause worsening of profile or narrowing of process (particularly, bake) margin.

[3] Other Additives

The positive resist composition of the present invention may further contain, if desired, an acid decomposable dissolution-inhibiting compound, a dye, a plasticizer, a surfactant, a photo-sensitizer, an organic basic compound, a compound of accelerating the dissolution in a developer, and the like.

The positive resist composition of the present invention preferably contains (C) a fluorine-containing surfactant and/or a silicon-containing surfactant.

The positive resist composition of the present invention preferably contains any one of or two or more of a fluorine-containing surfactant, a silicon-containing surfactant and a surfactant containing both a fluorine atom and a silicon atom.

When the positive resist composition of the present invention contains the acid decomposable resin and the surfactant, this is effective particularly in forming a pattern having a smaller line width and the development defect can be more improved.

Examples of these surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include fluorine-containing surfactants and silicon-containing surfactants, such as Eftop EF301 and EF303 (produced by Shin-Akita Kasei K. K.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, polysiloxane polymer KP-341 (produced by Shin-Etsu Chemical Co., Ltd.) may also be used as a silicon-containing surfactant.

The amount of the surfactant blended is usually from 0.001 to 2 wt %, preferably from 0.01 to 1 wt %, based on the solid content in the composition of the present invention. These surfactants can be used individually or in combination.

Examples of the surfactant which can be additionally used include a nonionic surfactant and specific examples thereof include polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ethers such as polyoxyethylene octyl phenol ether and polyoxyethylene nonyl phenol ether, polyoxyethylenepolyoxypropylene block copolymers, sorbitol fatty acid esters such as sorbitol monolaurate, sorbitol monopalmitate, sorbitol monostearate, sorbitol monooleate, sorbitol trioleate and sorbitol tristearate, and polyoxyethylene sorbitol fatty acid esters such as polyoxyethylene sorbitol monolaurate, polyoxyethylene sorbitol monopalmitate, polyoxyethylene sorbitol monostearate, polyoxyethylene sorbitol trioleate and polyoxyethylene sorbitol tristearate.

The amount of the additional surfactant blended is usually 2 parts by weight or less, preferably 1 part by weight or less, per 100 parts by weight of the solid content in the composition of the present invention.

The organic basic compound (D) which can be used in the present invention is preferably a compound having a stronger basicity than phenol, more preferably a nitrogen-containing basic compound.

(A)

wherein $R^{250}$, $R^{251}$ and $R^{252}$ each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, and $R^{251}$ and $R^{252}$ may combine with each other to form a ring.

(B)

(C)

(D)

-continued

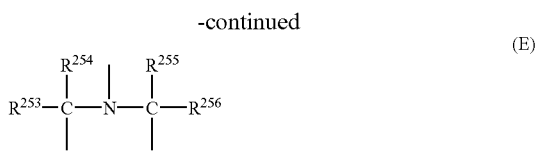

(E)

wherein $R^{253}$, $R^{254}$, $R^{255}$ and $R^{256}$ each independently represents an alkyl group having from 1 to 6 carbon atoms.

The compound is more preferably a nitrogen-containing basic compound having two or more nitrogen atoms different in the chemical environment within one molecule, still more preferably a compound having both a ring structure containing a substituted or unsubstituted amino group and a ring structure containing a nitrogen atom, or a compound having an alkylamino group. Specific preferred examples of the compound include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Specific preferred examples of the nitrogen-containing basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methyl-pyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]-non-5-ene, 1,8-diazabicyclo-[5.4.0]undec-7-ene, 1,4-diazabicyclo[2.2.2]octane, 2,4,5-triphenylimidazole, tertiary morpholine derivatives such as N-methylmorpholine, N-ethylmorpholine, N-hyroxyethylmorpholine, N-benzylmorpholine and cyclohexylmorpholinoethyl thiourea (CHMETU), and hindered amines described in JP-A-11-52575 (for example, those described in paragraph [0005]), however, the present invention is not limited thereto.

More preferred specific examples include 1,5-diazabicyclo[4.3.0]nona-5-ene, 1,8-diazabicyclo-[5.4.0]undec-7-ene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines such as CHMETU, and hindered amines such as bis(1,2,2,6,6-pentamethyl-4-piperidyl) sebacate.

Among these, particularly preferred are 1,5-diazabicyclo[4.3.0]nona-5-ene, 1,8-diazabicyclo[5.4.0]undeca-7-ene, 1,4-diazabicyclo[2.2.2]octane, 4-dimethylaminopyridine, hexamethylenetetramine, CHMETU and bis(1,2,2,6,6-pentamethyl-4-piperidyl) sebacate.

These nitrogen-containing compounds are used individually or in combination of two or more thereof. The amount of the nitrogen-containing compound used is usually from 0.001 to 10 wt %, preferably from 0.01 to 5 wt %, based on the solid content in the entire photosensitive resin composition. If the amount used is less than 0.001 wt %, no effect is obtained by the addition of the nitrogen-containing basic compound, whereas if it exceeds 10 wt %, reduction in the sensitivity or worsening in the developability of the unexposed area is liable to occur.

The positive resist composition of the present invention is dissolved in a solvent which can dissolve the above-described respective components, and then coated on a support. The solvent used here is preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone or tetrahydrofuran. These solvents are used individually or in combination.

Among these solvents, preferred are propylene glycol monomethyl ether acetate, 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, methyl lactate, ethyl lactate, methyl methoxypropionate, ethyl ethoxypropionate, N-methylpyrrolidone and tetra-hydrofuran.

The positive resist composition of the present invention is coated on a substrate to form a thin film. The film thickness of this coating is preferably from 0.2 to 1.2 μm.

Examples of the inorganic substrate which can be used in the present invention include a normal bare Si substrate, an SOG substrate and a substrate having an inorganic antireflection film described below.

In the present invention, a commercially available inorganic or organic antireflection film can be used, if desired.

The antireflection film which can be used includes an inorganic film type such as titanium, titanium dioxide, titanium nitride, chromium oxide, carbon and α-silicon, and an organic film type comprising a light absorbent and a polymer material. For forming the former film, equipment such as vacuum evaporation apparatus, CVD apparatus or sputtering apparatus is necessary. Examples of the organic antireflection film include a film comprising a condensate of a diphenylamine derivative and a formaldehyde-modified melamine resin, an alkali-soluble resin and a light absorbent described in JP-B-7-69611, a reactant between a maleic anhydride copolymer and a diamine-type light absorbent described in U.S. Pat. No. 5,294,680, a film containing a resin binder and a methylolmelamine-base thermal crosslinking agent described in JP-A-6-118631, an acrylic resin-type antireflection film having a carboxylic acid group, an epoxy group and a light-absorbing group within the same molecule described in JP-A-6-118656, a film comprising methylolmelamine and benzophenone-base light absorbent described in JP-A-8-87115, and a film where a low molecular light absorbent is added to a polyvinyl alcohol resin described in JP-A-8-179509.

In addition, DUV30 series, DUV-40 series and ARC25 produced by BREWER Science, and AC-2, AC-3, AR19 and AR20 produced by Shipley may be also used as the organic antireflection film.

The resist solution is coated on a substrate as used in precision integrated circuit devices (e.g., silicon/silicon dioxide coated substrate) (if desired, on a substrate having provided thereon the above-described antireflection film) by an appropriate coating method such as spinner or coater, exposed through a predetermined mask, and developed by baking, whereby a good resist pattern can be obtained. The exposure light is preferably light at a wavelength of 150 to 250 nm. Specific examples thereof include KrF excimer laser (248 nm), ArF excimer laser (193 nm), $F_2$ excimer laser (157 nm), X ray and electron beam.

The developer which can be used is an aqueous solution of an alkali such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide, tetraethylammonium hydroxide) and cyclic amines (e.g., pyrrole, piperidine).

This alkaline aqueous solution may be used after adding thereto an appropriate amount of an alcohol or surfactant.

EXAMPLE

The present invention is described in greater detail below, however, the present invention should not be construed as being limited thereto.

Example I

Synthesis of Resin (1):

2-Ethyl-2-adamantyl methacrylate, isoadamantyl methacrylate, butyrolactone methacrylate and methacrylic acid were charged at a ratio of 25/25/40/10 and dissolved in methyl isobutyl ketone to prepare 100 mL of a solution having a solid concentration of 30%. To this solution, 4 mol % of V-601 (produced by Wako Pure Chemical Industries, Ltd.) was added and the resulting solution was added dropwise to 10 mL of methyl isobutyl ketone heated at 80° C., over 4 hours in a nitrogen atmosphere. After the completion of dropwise addition, the reaction solution was stirred under heating for 4 hours. After the completion of reaction, the reaction solution was cooled to room temperature and crystallized in 1 L of a 1/1 mixed solvent of distilled water/ISO propyl alcohol, the precipitated white powder was washed with 1 L of methanol, and the objective resin (1) was recovered.

The polymer composition ratio determined by $C^{13}NMR$ was 22/27/39/12. The weight average molecular weight in terms of standard polystyrene determined by GPC was 8,700.

Resins having a composition ratio and a molecular weight shown in the Table below were synthesized in the same manner as above (repeating units 1, 2, 3 and 4 show the order of the structural formula from the left).

TABLE I-1

| Resin | Repeating Unit 1 (mol %) | Repeating Unit 2 (mol %) | Repeating Unit 3 (mol %) | Repeating Unit 3 (mol %) | Molecular Weight |
|---|---|---|---|---|---|
| 2 | 26 | 25 | 36 | 13 | 9100 |
| 3 | 25 | 24 | 36 | 15 | 8900 |
| 4 | 28 | 26 | 34 | 12 | 9000 |
| 5 | 24 | 28 | 22 | 26 | 8100 |
| 6 | 29 | 20 | 26 | 25 | 7100 |
| 7 | 28 | 20 | 25 | 27 | 9400 |
| 8 | 30 | 21 | 47 | 2 | 10200 |
| 9 | 26 | 23 | 18 | 33 | 7800 |
| 10 | 26 | 28 | 34 | 12 | 9200 |
| 11 | 20 | 33 | 30 | 17 | 8600 |
| 12 | 30 | 25 | 42 | 3 | 10200 |
| 13 | 28 | 28 | 35 | 10 | 9300 |
| 14 | 35 | 25 | 20 | 20 | 8500 |
| 15 | 26 | 25 | 35 | 14 | 8200 |
| 16 | 20 | 18 | 41 | 21 | 9700 |
| 17 | 15 | 18 | 40 | 27 | 10100 |
| 18 | 17 | 19 | 44 | 20 | 8400 |

The structures of Resins (1) to (18) are shown below.

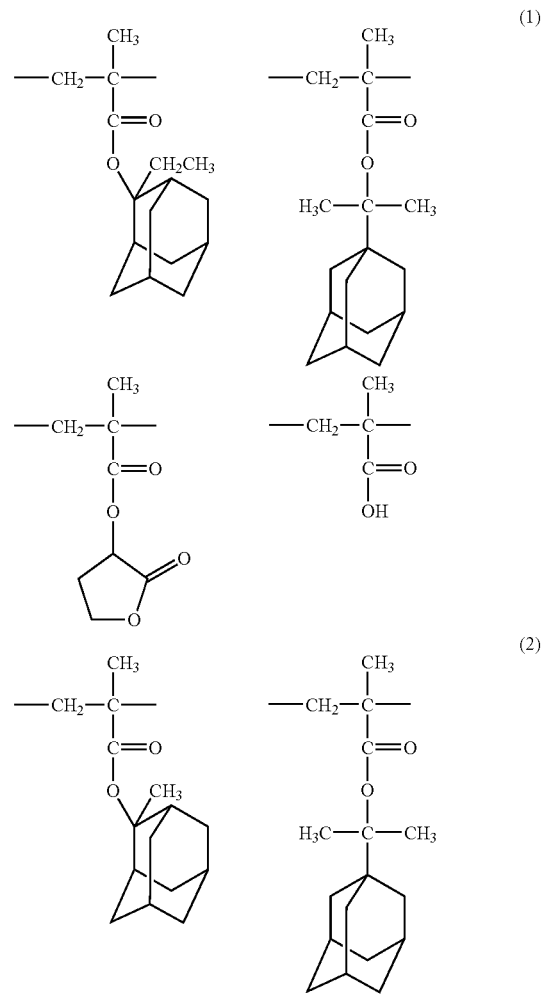

-continued
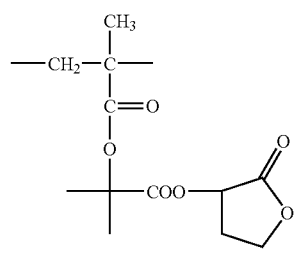 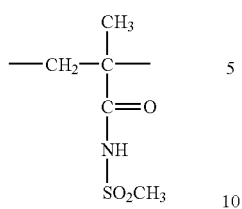
(3)
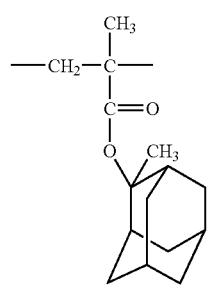 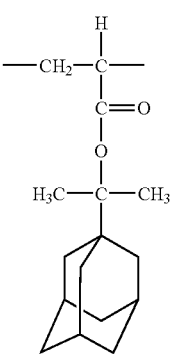
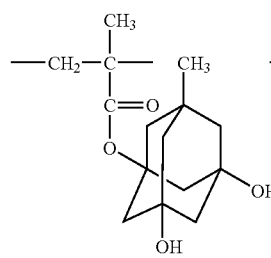 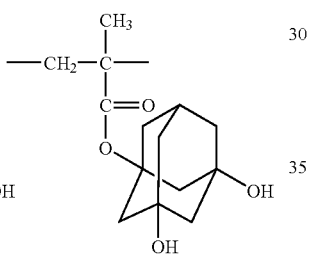
(4)
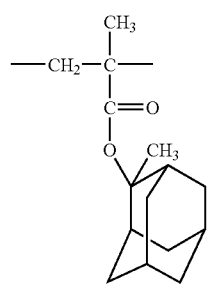 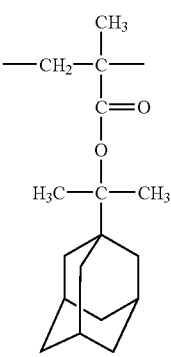
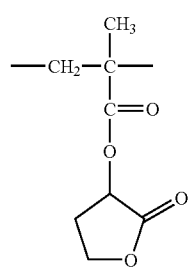 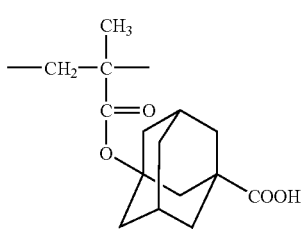
-continued
(5)
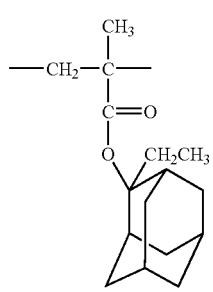 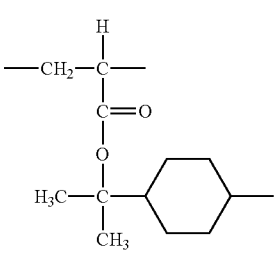
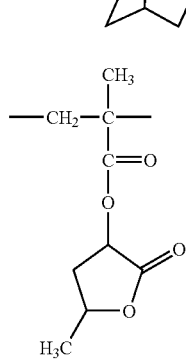 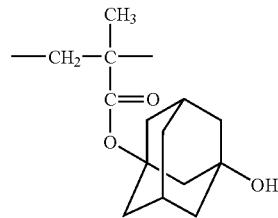
(6)
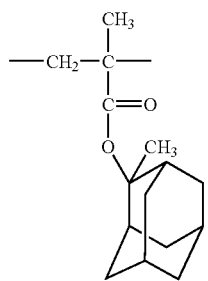 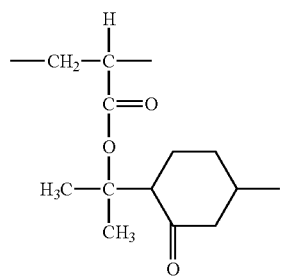
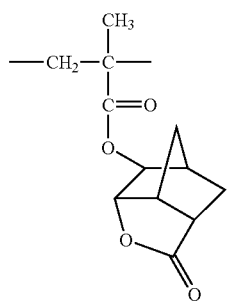 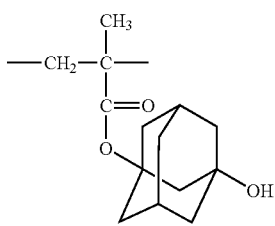
(7)
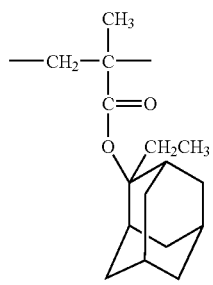 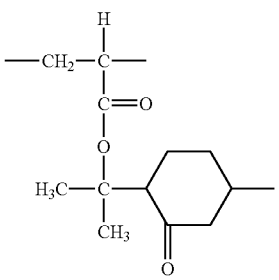

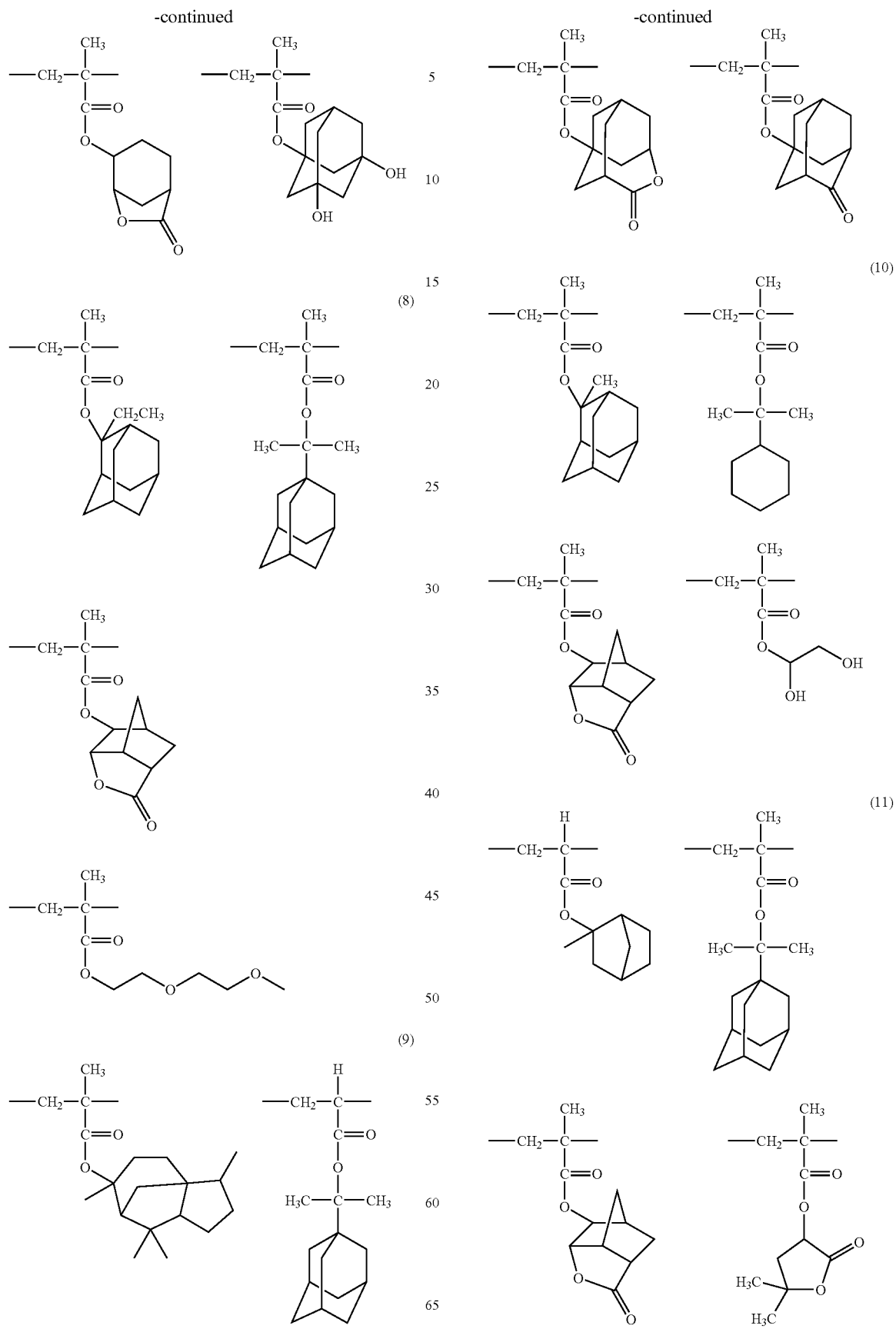

-continued
(12)
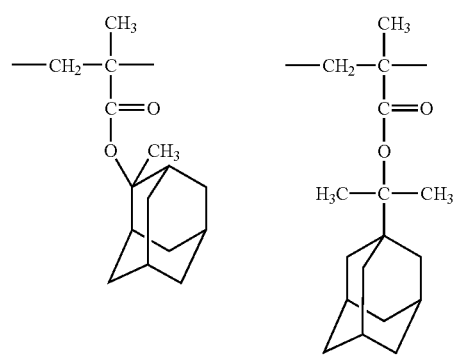
(14)
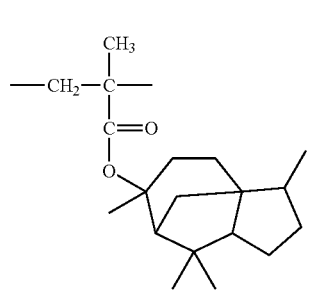
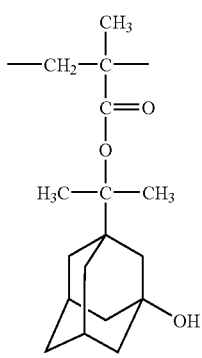
(13)
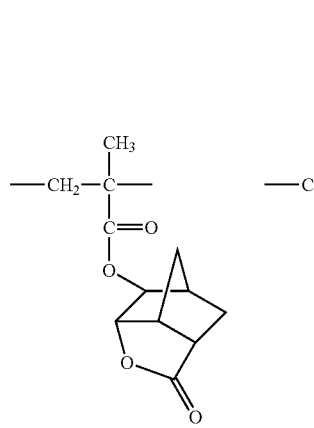
(15)
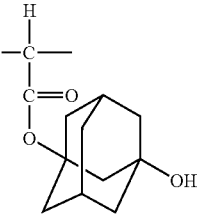

-continued

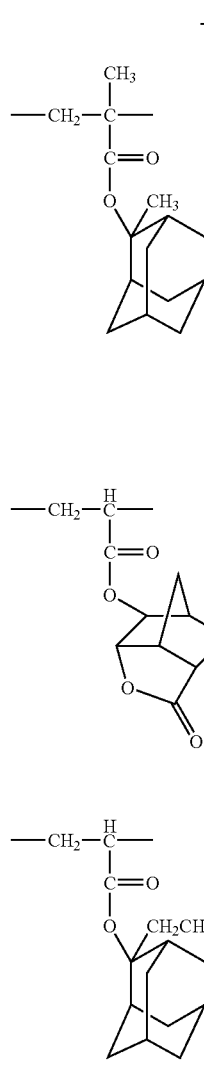

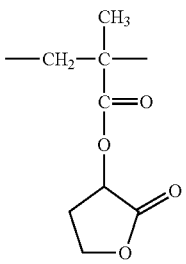

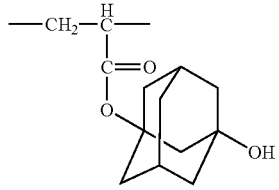

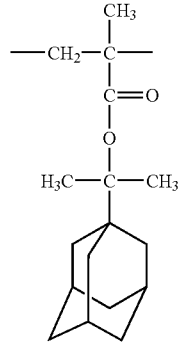

Examples I-1 to I-18 and Comparative Example I-1

Preparation and Evaluation of Positive Resist Composition

Respective components shown in Table I-2, which were prepared above, were blended and dissolved in propylene glycol monomethyl ether acetate each to a ratio of 14 wt % as a solid content. The obtained solution was filtered through a microfilter of 0.1 μm to prepare positive resist compositions of Examples I-1 to I-18 and Comparative Example I-1.

TABLE I-2

| | Resin (1.5 g) | Photo-Acid Generator | Basic Compound (4 mg) | Surfactant (10 mg) |
|---|---|---|---|---|
| Example I-1 | (1) | PAG 4-6 = 32 mg | none | W4 |
| I-2 | (2) | PAG 4-36 = 30 mg | 1 | None |
| I-3 | (3) | PAG 4-38/4-39 = 5/29 mg | 2 | W5 |
| I-4 | (4) | PAG 4-38/4-56 = 28/10 mg | 4 | W5 |
| I-5 | (5) | PAG 4-52/4-54 = 20/20 mg | 5 | W3 |
| I-6 | (6) | PAG 4-45 = 32 mg | 6 | W2 |
| I-7 | (7) | PAG 4-34/4-53 = 10/30 mg | 3 | W1 |
| I-8 | (8) | PAG 3-21/4-50 = 10/20 mg | 4 | W5 |

TABLE I-2-continued

| | Resin (1.5 g) | Photo-Acid Generator | Basic Compound (4 mg) | Surfactant (10 mg) |
|---|---|---|---|---|
| I-9 | (9) | PAG 4-48/4-55 = 26/20 mg | 5 | W5 |
| I-10 | (10) | PAG 4-39/6-27 = 30/5 mg | 6 | W5 |
| I-11 | (11) | PAG 4-5/4-53 = 5/35 mg | 4 | W3 |
| I-12 | (12) | PAG 4-36/4-56 = 10/40 mg | 3 | W2 |
| I-13 | (13) | PAG 4-50/4-55 = 20/30 mg | 1 | W1 |
| I-14 | (14) | PAG 4-49/4-53 = 5/40 mg | 2 | W2 |
| I-15 | (15) | PAG 4-53/7-5 = 30/10 mg | 3 | W3 |
| I-16 | (16) | PAG 4-48 = 40 mg | 5 | W5 |
| I-17 | (17) | PAG 4-48 = 40 mg | 5 | W5 |
| I-18 | (18) | PAG 4-48 = 40 mg | 5 | W5 |
| Comparative Example I-1 | (R) | PAG 4-5 = 30 mg | none | none |

The surfactants show the followings:
W1: Megafac F176 (produced by Dainippon Ink & Chemicals, Inc.) (fluorine-containing)
W2: Megafac R08 ((produced by Dainippon Ink & Chemicals, Inc.) (fluorine and silicon-containing)
W3: polysiloxane polymer KP-341 (produced by Shin-Etsu Chemical Co., Ltd.)
W4: polyoxyethylene nonyl phenyl ether
W5: Troysol S-366 (produced by Troy Chemical)
The amines show the followings:
1: 1,5-diazabicyclo[4.3.0]-5-nonene (DBN)
2: bis(1,2,2,6,6-pentamethyl-4-piperidyl) sebacate
3: tri-n-butylamine
4: triphenylimidazole
5: antipyrine
6: 2,6-diisopropylaniline Comparative Resin R:
2-methyl-2-adamantyl methacrylate/mevalonic lactone methacrylate/tert-butyl methacrylate (50/30/20 by mol) synthesized according to the Example of JP-A-11-119434

AR-19 produced by Brewer Science was coated on a silicon wafer to 85 nm using a spin coater and dried. Thereon, the positive photoresist composition obtained above was coated and dried at 140° C. for 90 seconds to form a positive photoresist film of about 0.4 µm. The positive photoresist film was exposed to an ArF excimer laser (ArF stepper manufactured by ISI, wavelength: 193 nm, NA=0.6) while changing the exposure amount by a 1/2 pitch contact hole pattern (mask size: 0.15 micron). After the exposure, the resist film was heat-treated at 120° C. for 90 seconds, developed with an aqueous 2.38 wt % tetramethylammonium hydroxide solution and rinsed with distilled water to obtain a resist pattern profile.

The thus-obtained resist pattern on the silicon wafer was observed through a scanning-type microscope and the resist was evaluated as follows.

Sensitivity

The minimum exposure amount necessary for reproducing a contact hole having a diameter of 0.15 µm was used as the sensitivity and the relative exposure amount by taking the exposure amount of resist of Example I-1 as 1.0 was expressed as the relative sensitivity (exposure amount of resist evaluated/exposure amount of resist of Example I-1).

Defocus Latitude Depended on Line Pitch

In each of 0.15 µm contact hole (dense pattern, pitch: 1/2) and lone contact hole pattern (loose pattern, pitch: 1/10), the overlap range of focus depth with an allowance of 0.15 µm±10% was determined. The larger range is better.

Surface Roughening at Etching:

A 0.15 µm contact hole pattern was etched by $CHF_3O_2$=8/2 plasma for 60 seconds and the cross section and surface of the obtained sample was observed through SEM. The sample where pinhole-like defect was generated (lower layer at the site not to be processed was etched) was rated X, the sample where although the surface was roughened, defect was not generated but the hole was deformed was rated Δ, and the sample where the surface roughening was small and the hole was not deformed was rated ○.

TABLE I-3

| | Sensitivity | Defocus Latitude Depended on Line Pitch (µm) | Surface Roughening at Etching |
|---|---|---|---|
| Example I-1 | 1 | 0.4 | ○ |
| I-2 | 1.1 | 0.45 | ○ |
| I-3 | 0.95 | 0.55 | ○ |
| I-4 | 0.9 | 0.6 | ○ |
| I-5 | 1.15 | 0.5 | ○ |
| I-6 | 1.15 | 0.5 | ○ |
| I-7 | 1.15 | 0.5 | ○ |
| I-8 | 1.1 | 0.55 | ○ |
| I-9 | 1.05 | 0.55 | ○ |
| I-10 | 0.9 | 0.6 | ○ |
| I-11 | 0.8 | 0.6 | ○ |
| I-12 | 0.95 | 0.55 | ○ |
| I-13 | 0.85 | 0.6 | ○ |
| I-14 | 0.9 | 0.6 | ○ |
| I-15 | 1.0 | 0.55 | ○ |
| I-16 | 1.25 | 0.6 | ○ |
| I-17 | 1.25 | 0.6 | ○ |
| I-18 | 1.2 | 0.6 | ○ |
| Comparative Example I-1 | 1.85 | 0.1 | X |

As is apparent from the results in Table I-3, the positive resist composition of the present invention is excellent by having high sensitivity, small defocus latitude depended on line pitch and less surface roughening at the etching.

Example II

Synthesis of Acid Decomposable Resin (Aa):
2-Ethyl-2-adamantyl methacrylate, butyrolactone methacrylate and methacrylic acid were charged at a ratio of 50/45/5 and dissolved in methyl isobutyl ketone to prepare 100 mL of a solution having a solid concentration of 30%.

To this solution, 4 mol % of V-601 (produced by Wako Pure Chemical Industries, Ltd.) was added and the resulting solution was added dropwise to 10 mL of methyl isobutyl ketone heated at 70° C., over 4 hours in a nitrogen atmosphere. After the completion of dropwise addition, the reaction solution was stirred under heating for 4 hours. After the completion of reaction, the reaction solution was cooled to room temperature and crystallized in 1 L of a 1/1 mixed solvent of distilled water/isopropyl alcohol, the precipitated white powder was washed with 1 L of methanol, and the objective resin (1a) was recovered.

The polymer composition ratio determined by $C^{13}$NMR was 43/50/7. The weight average molecular weight in terms of standard polystyrene determined by GPC was 8,900.

Resins having a composition ratio and a molecular weight shown in the Table below were synthesized in the same manner as above. Repeating units 1, 2, 3 and 4 show the order of the structural formula from the left.

TABLE II-1

| Resin | Repeating Unit 1 (mol %) | Repeating Unit 2 (mol %) | Repeating Unit 3 (mol %) | Repeating Unit 4 (mol %) | Molecular Weight |
|---|---|---|---|---|---|
| 2a | 52 | 42 | 6 | | 9400 |
| 3a | 48 | 29 | 23 | | 9100 |
| 4a | 53 | 20 | 27 | | 9300 |
| 5a | 50 | 28 | 22 | | 7900 |
| 6a | 41 | 23 | 36 | | 10100 |
| 7a | 45 | 35 | 20 | | 9900 |
| 8a | 51 | 22 | 25 | 2 | 11000 |
| 9a | 52 | 10 | 23 | 15 | 8100 |
| 10a | 55 | 30 | 15 | | 9300 |
| 11a | 42 | 30 | 18 | | 8300 |
| 12a | 50 | 11 | 35 | 4 | 8800 |
| 13a | 48 | 28 | 20 | 4 | 9600 |
| 14a | 55 | 21 | 24 | | 8700 |
| 15a | 26 | 23 | 25 | 26 | 9200 |

The structures of Resins (1a) to (15a) are shown below.

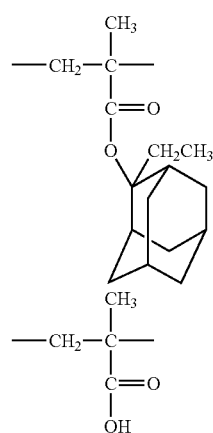

(1a)

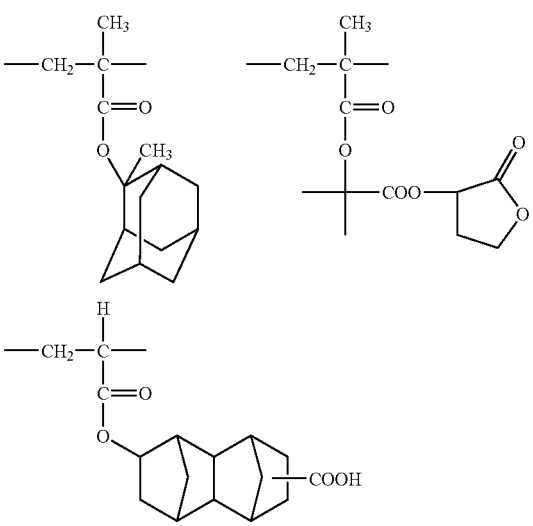

(2a)

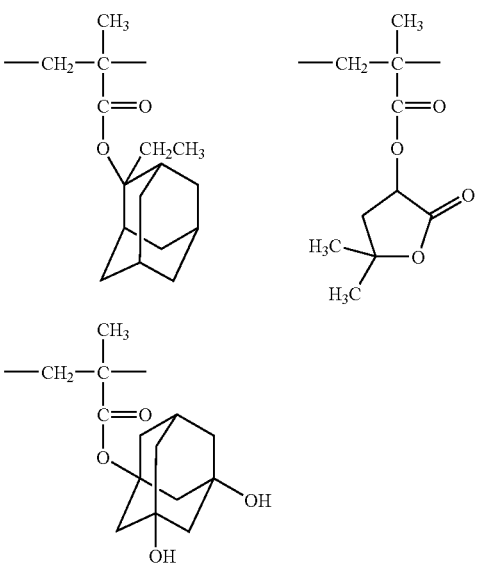

(3a)

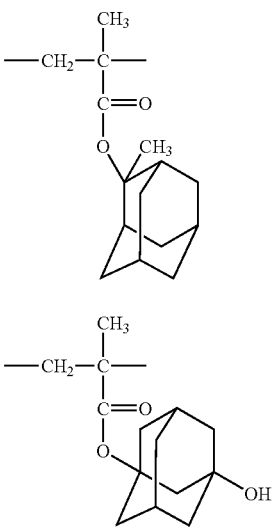

(4a)

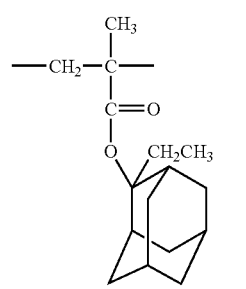 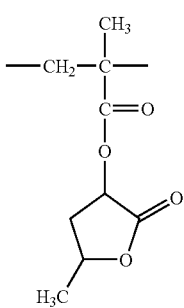 (5a)
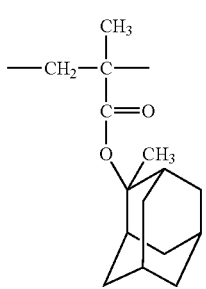 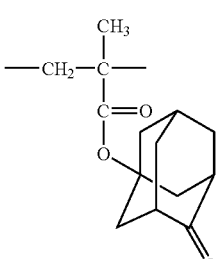 (8a)
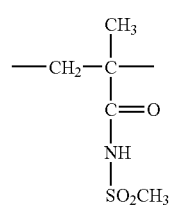
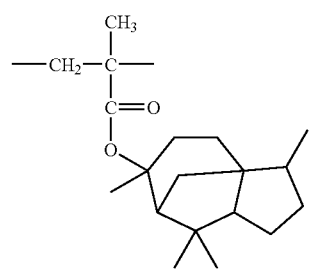 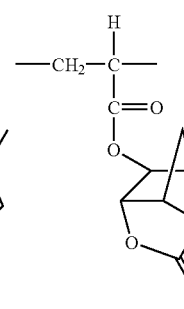 (6a)
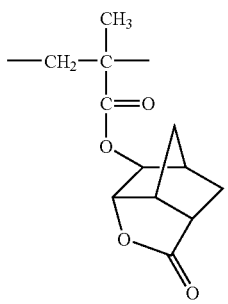
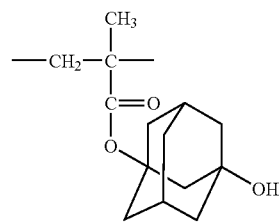
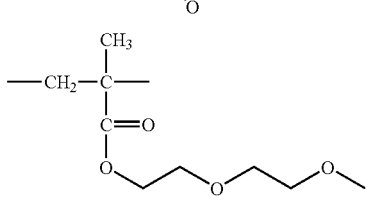
(7a)
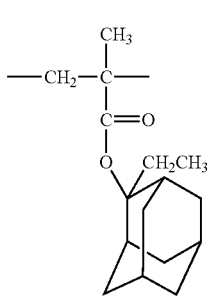
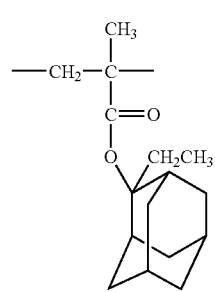 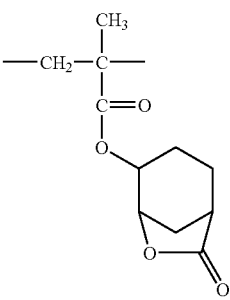
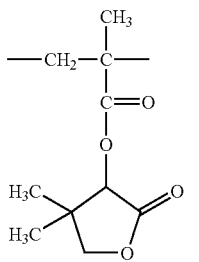 (9a)
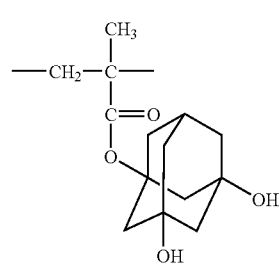
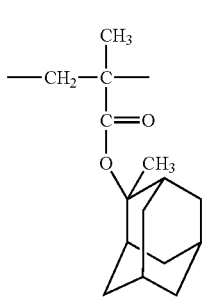 (10a)

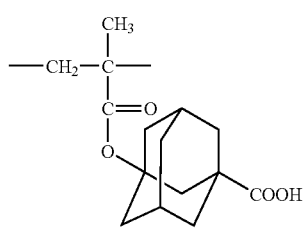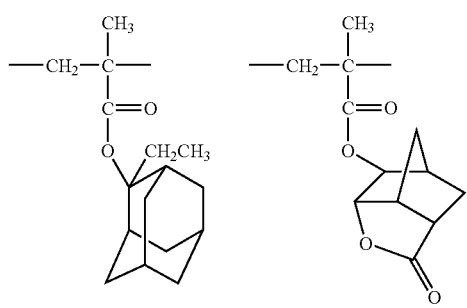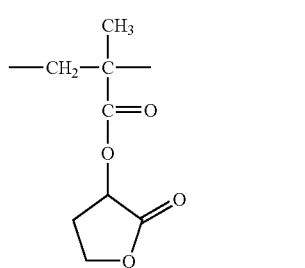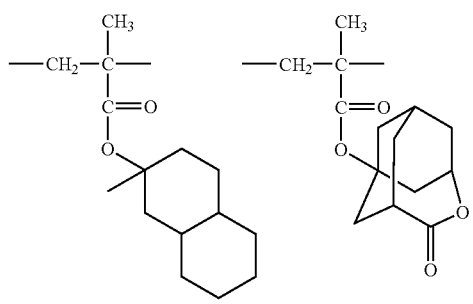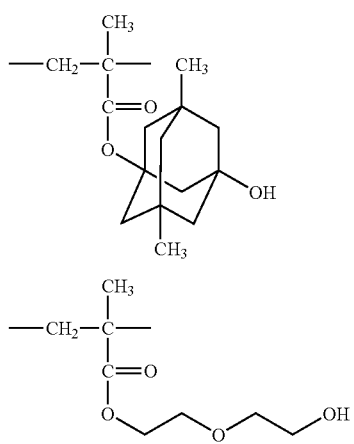
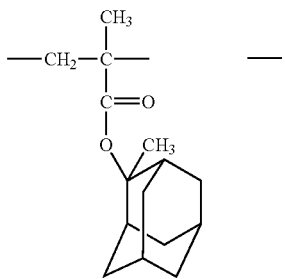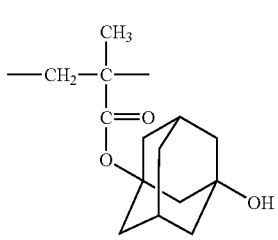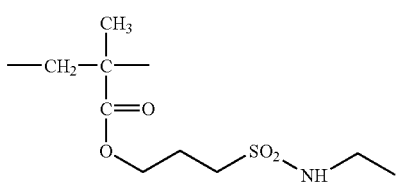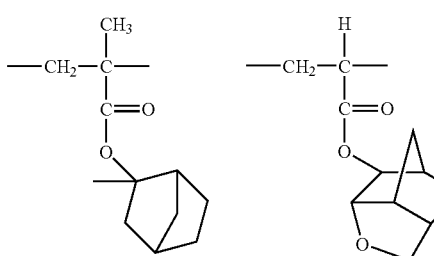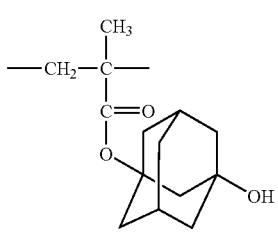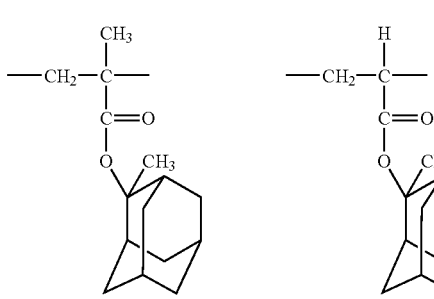

-continued

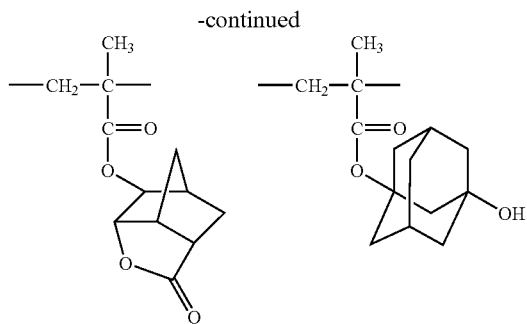

Synthesis of Acid Decomposable Resin (Ab):

Isoadamantyl methacrylate, methacrylate having a structure shown below and methacrylic acid were charged at a ratio of 46/40/14 and dissolved in methyl ethyl ketone to prepare 100 mL of a solution having a solid concentration of 30%.

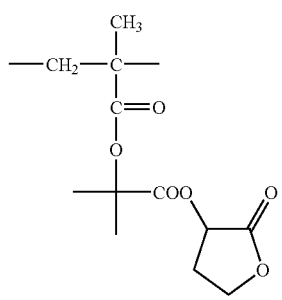

To this solution, 1 mol % of V-601 (produced by Wako Pure Chemical Industries, Ltd.) and 2 mol % of 2-ethylhexyl mercaptopropionate were added and the resulting solution was added dropwise to 10 mL of methyl isobutyl ketone heated at 70° C., over 4 hours in a nitrogen atmosphere. After the completion of dropwise addition, the reaction solution was stirred under heating for 4 hours. After the completion of reaction, the reaction solution was cooled to room temperature and crystallized in 1 L of a 1/1 mixed solvent of distilled water/isopropyl alcohol, the precipitated white powder was washed with 1 L of methanol, and the objective resin (1b) was recovered.

The polymer composition ratio determined by $C^{13}$NMR was 45/40/15. The weight average molecular weight in terms of standard polystyrene determined by GPC was 12,100.

Resins having a composition ratio and a molecular weight shown in the Table below were synthesized in the same manner as above. Repeating units 1, 2, 3 and 4 show the order of the structural formula from the left.

TABLE II-2

| Resin | Repeating Unit 1 (mol %) | Repeating Unit 2 (mol %) | Repeating Unit 3 (mol %) | Repeating Unit 4 (mol %) | Molecular Weight |
|---|---|---|---|---|---|
| 2b | 46 | 22 | 32 | | 10400 |
| 3b | 49 | 29 | 22 | | 10500 |
| 4b | 46 | 20 | 34 | | 11300 |
| 5b | 44 | 20 | 26 | 10 | 10900 |
| 6b | 49 | 28 | 23 | | 12200 |
| 7b | 23 | 25 | 25 | 27 | 13100 |
| 8b | 46 | 28 | 22 | 4 | 11700 |
| 9b | 57 | 20 | 23 | | 10800 |
| 10b | 48 | 26 | 24 | 2 | 11400 |
| 11b | 43 | 29 | 28 | | 10900 |
| 12b | 46 | 30 | 24 | | 9300 |
| 13b | 48 | 24 | 22 | 6 | 9900 |
| 14b | 47 | 24 | 21 | 8 | 10700 |
| 15b | 42 | 13 | 18 | 27 | 11200 |

The structures of Resins (1b) to (15b) are shown below.

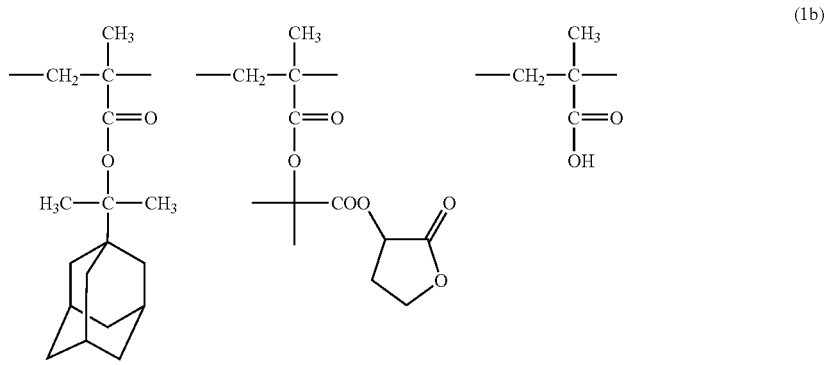

(1b)

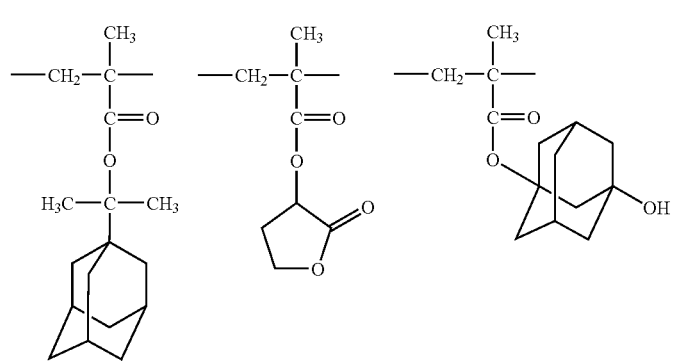
(2b)
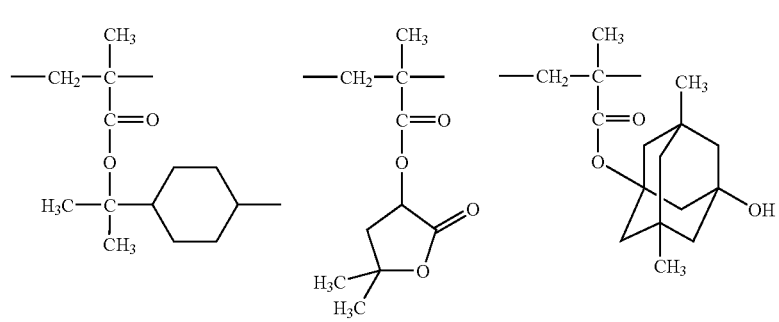
(3b)
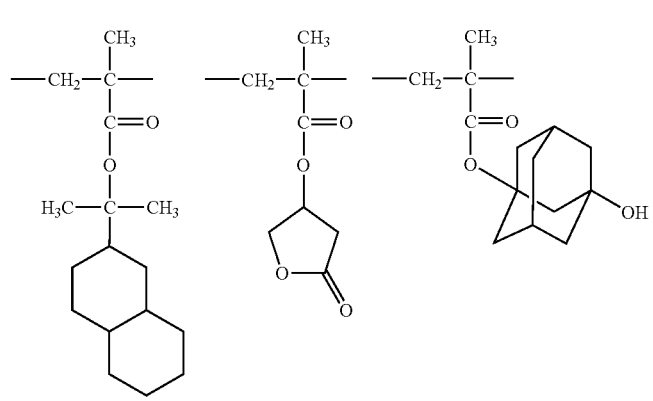
(4b)
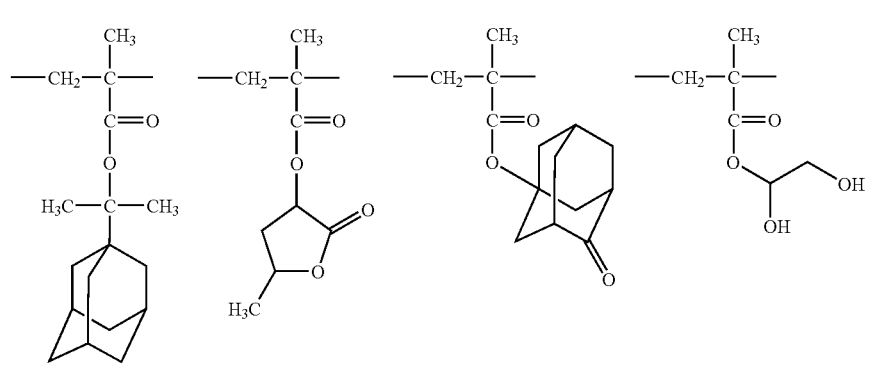
(5b)

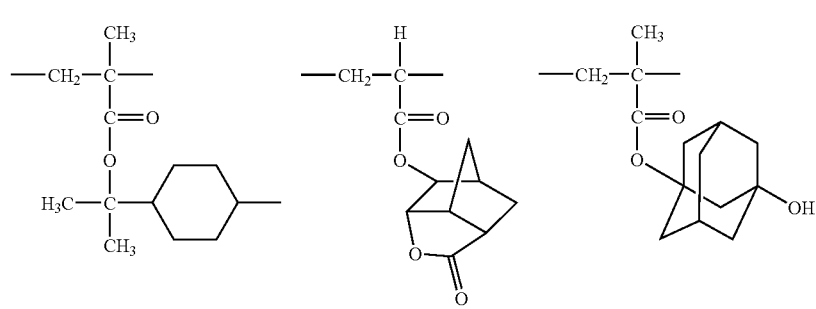
(6b)
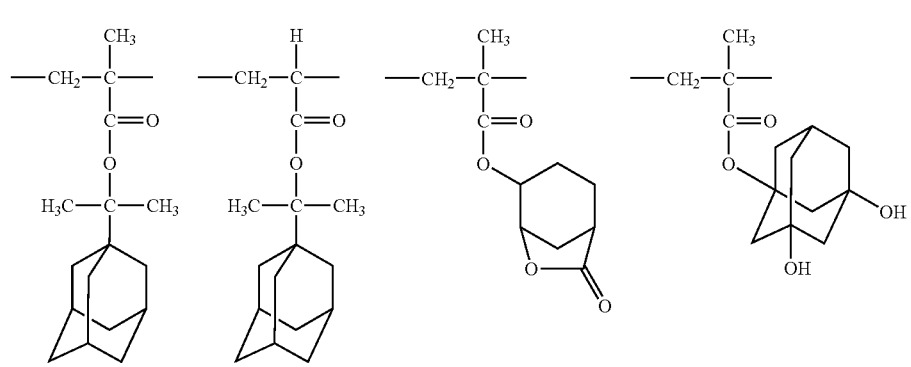
(7b)
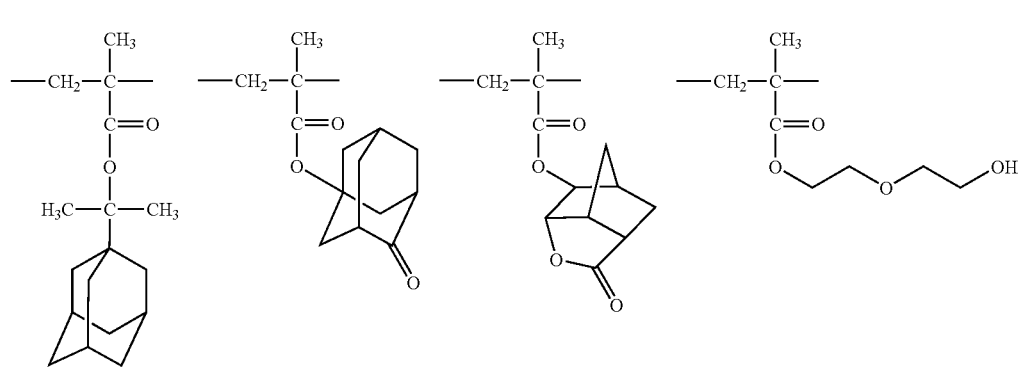
(8b)
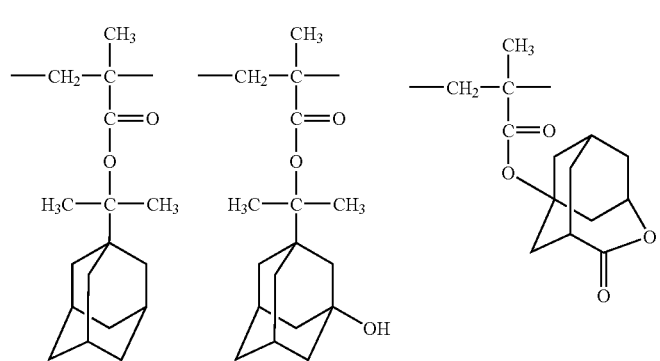
(9b)

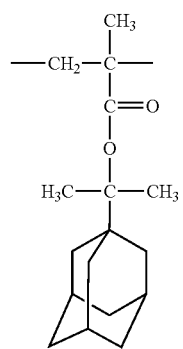 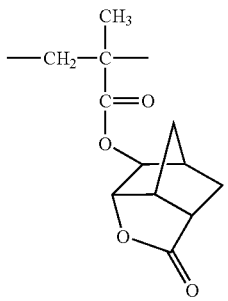 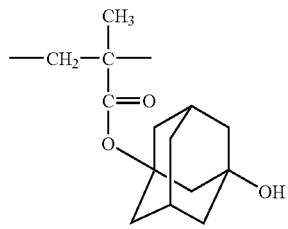 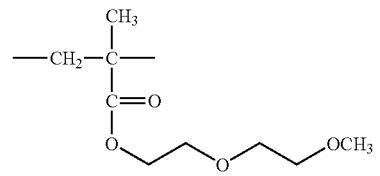
(10b)
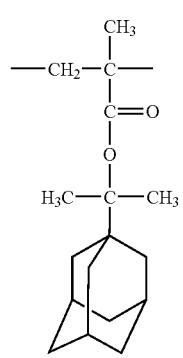 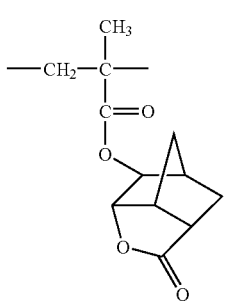 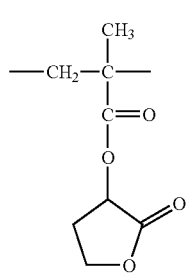
(11b)
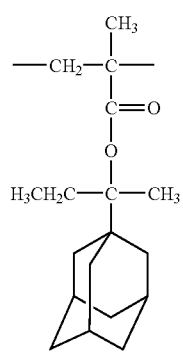 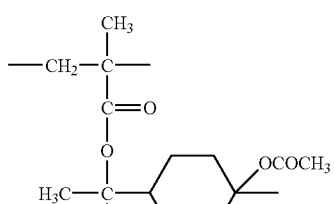 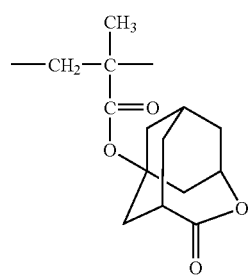
(12b)
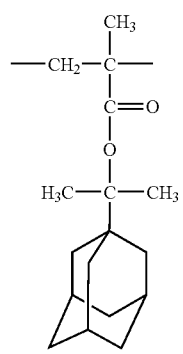 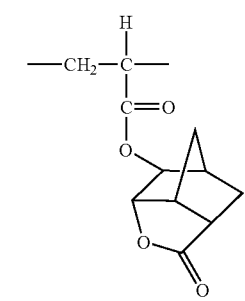 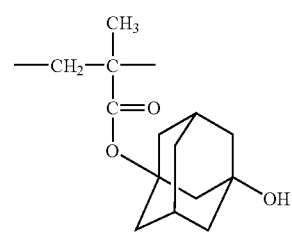 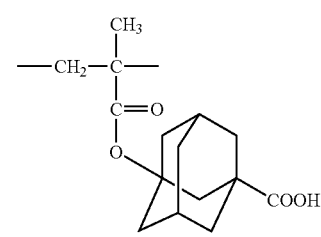
(13b)

-continued

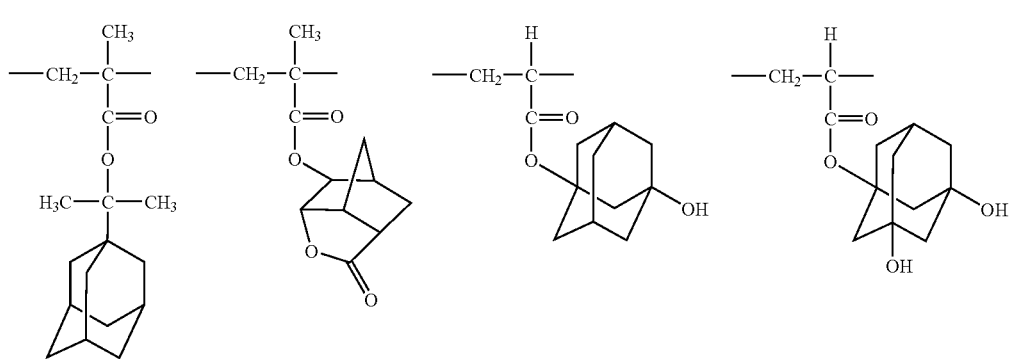
(14b)

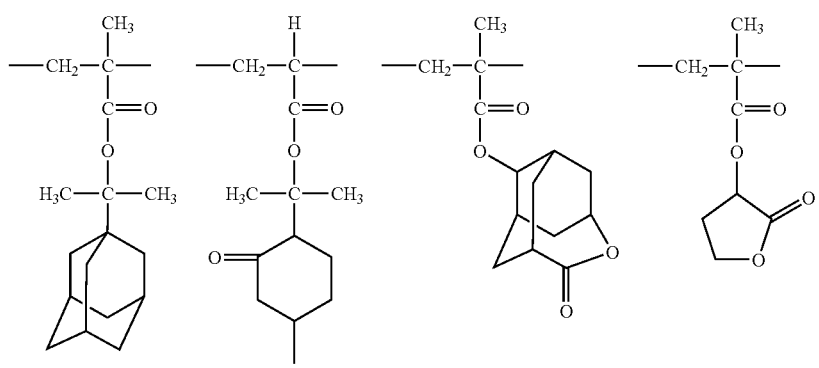
(15b)

Examples II-1 to II-15 and Comparative Example II-1

(Preparation and Evaluation of Positive Resist Composition)

Respective components shown in Table II-3, which were prepared above, were blended and dissolved in propylene glycol monomethyl ether acetate each to a ratio of 14 wt % as a solid content. The obtained solution was filtered through a microfilter of 0.1 μm to prepare positive resist compositions of Examples II-1 to II-15 and Comparative Example II-1.

TABLE II-3

|  | Resin | Photo-Acid Generator (mg) | Basic Compound (4 mg) | Surfactant (10 mg) |
|---|---|---|---|---|
| Example II-1 | (1a)/(7b) = 0.7/0.8 g | PAG 4-36 = 30 mg | none | W4 |
| II-2 | (2a)/(8b) = 0.8/0.7 g | PAG 4-6 = 31 mg | 1 | none |
| II-3 | (3a)/(9b) = 0.1/1.4 g | PAG 4-52/4-54 = 10/30 mg | 2 | W5 |
| II-4 | (4a)/(10b) = 1.3/0.2 g | PAG 4-38/4-39 = 6/30 mg | 4 | W5 |
| II-5 | (5a)/(11b) = 0.5/1.0 g | PAG 4-39/6-27 = 28/4 mg | 5 | W3 |
| II-6 | (6a)/(12b) = 0.9/0.6 g | PAG 4-48/4-56 = 30/5 mg | 6 | W2 |
| II-7 | (7a)/(13b) = 0.4/1.1 g | PAG 4-50/4-55 = 20/40 mg | 3 | W1 |
| II-8 | (8a)/(14b) = 1.0/0.5 g | PAG 4-45 = 30 mg | 4 | W5 |
| II-9 | (9a)/(15b) = 0.6/0.9 g | PAG 4-36/4-56 = 10/50 mg | 5 | W5 |
| II-10 | (10a)/(1b) = 0.8/0.7 g | PAG 4-5/4-53 = 10/20 mg | 6 | W5 |
| II-11 | (11a)/(2b) = 0.9/0.6 g | PAG 4-48/4-55 = 20/40 mg | 4 | W3 |
| II-12 | (12a)/(3b) = 0.7/0.8 g | PAG 4-34/4-53 = 10/25 mg | 3 | W2 |
| II-13 | (13a)/(4b) = 0.5/1.0 g | PAG 4-53/7-5 = 30/5 mg | 1 | W1 |
| II-14 | (14a)/(5b) = 0.7/1.8 g | PAG 3-21/4-52 = 10/22 mg | 2 | W2 |

TABLE II-3-continued

| | Resin | Photo-Acid Generator (mg) | Basic Compound (4 mg) | Surfactant (10 mg) |
|---|---|---|---|---|
| II-15 | (15a)/(6b) = 0.3/1.2 g | PAG 4-49/4-53 = 6/30 mg | 3 | W3 |
| Comparative Example II-1 | (1a) 1.5 g | PAG 4-5 = 30 mg | none | none |
| Comparative Example II-2 | (1b) 1.5 g | PAG 4-5 = 30 mg | none | none |

The surfactants show the followings:
W1: Megafac F176 (produced by Dainippon Ink & Chemicals, Inc.) (fluorine-containing)
W2: Megafac R08 ((produced by Dainippon Ink & Chemicals, Inc.) (fluorine and silicon-containing)
W3: polysiloxane polymer KP-341 (produced by Shin-Etsu Chemical Co., Ltd.)
W4: polyoxyethylene nonyl phenyl ether
W5: Troysol S-366 (produced by Troy Chemical)
The amines show the followings:
1: 1,5-diazabicyclo[4.3.0]-5-nonene (DBN)
2: bis (1,2,2,6,6-pentamethyl-4-piperidyl) sebacate
3: tri-n-butylamine
4: triphenylimidazole
5: antipyrine
6: 2,6-diisopropylaniline DUV30 produced by Brewer Science was coated on a silicon wafer to 1,600 nm using a spin coater and dried. Thereon, the positive photoresist composition obtained above was coated and dried at 140° C. for 90 seconds to form a positive photoresist film of about 0.4 µm. The positive photoresist film was exposed to an ArF excimer laser (ArF stepper manufactured by ISI, wavelength: 193 nm, NA=0.6) while changing the exposure amount by a 1/2 pitch contact hole pattern (mask size: 0.15 micron). After the exposure, the resist film was heat-treated at 120° C. for 90 seconds, developed with an aqueous 2.38 wt % tetramethylammonium hydroxide solution and rinsed with distilled water to obtain a resist pattern profile.

The thus-obtained resist pattern on the silicon wafer was observed through a scanning-type microscope and the resist was evaluated as follows.

Sensitivity:
The minimum exposure amount necessary for reproducing a contact hole having a diameter of 0.15 µm was used as the sensitivity and the relative exposure amount by taking the exposure amount of resist of Example II-1 as 1.0 was expressed as the relative sensitivity (exposure amount of resist evaluated/exposure amount of resist of Example II-1).

Defocus Latitude Depended on Line Pitch:
In each of 0.15 µm contact hole (dense pattern, pitch: 1/2) and lone contact hole pattern (loose pattern, pitch: 1/10), the overlap range of focus depth with an allowance of 0.15 µm±10% was determined. The larger range is better.

Surface Roughening at Etching:
A 0.15 µm contact hole pattern was etched by $CHF_3O_2$=8/2 plasma for 60 seconds and the cross section and surface of the obtained sample was observed through SEM. The sample where pinhole-like defect was generated (lower layer at the site not to be processed was etched) was rated X, the sample where although the surface was roughened, defect was not generated but the hole was deformed was rated Δ, and the sample where the surface roughening was small and the hole was not deformed was rated ○.

The results are shown in Table II-4.

TABLE II-4

| | Sensitivity | Defocus Latitude Depended on Line Pitch (µm) | Surface Roughening at Etching |
|---|---|---|---|
| Example II-1 | 1 | 0.45 | ○ |
| II-2 | 1.0 | 0.45 | ○ |
| II-3 | 0.9 | 0.4 | Δ |
| II-4 | 1.3 | 0.45 | ○ |
| II-5 | 0.95 | 0.6 | ○ |
| II-6 | 1.0 | 0.6 | ○ |
| II-7 | 0.95 | 0.6 | ○ |
| II-8 | 1.1 | 0.6 | ○ |
| II-9 | 0.95 | 0.6 | ○ |
| II-10 | 1.0 | 0.6 | ○ |
| II-11 | 1.05 | 0.6 | ○ |
| II-12 | 1.0 | 0.6 | ○ |
| II-13 | 0.95 | 0.6 | ○ |
| II-14 | 1.0 | 0.6 | ○ |
| II-15 | 0.95 | 0.6 | ○ |
| Comparative Example II-1 | 1.8 | 0.1 | ○ |
| II-2 | 0.9 | 0.15 | X |

As is apparent from the results in Table II-4, the positive resist composition of the present invention is excellent by having high sensitivity, small defocus latitude depended on line pitch and less surface roughening at the etching.

According to the present invention, a positive resist composition having high sensitivity, small defocus latitude depended on line pitch and less surface roughening at the etching can be provided. This positive resist composition of the present invention can be suitably used for microfabrication using far ultraviolet ray, particularly, ArF excimer laser ray.

While the invention has been described in detail and with reference to specific embodiments thereof, it will be apparent to one skilled in the art that various changes and modifications can be made therein without departing from the spirit and scope thereof.

What is claimed is:

1. A positive resist composition comprising (A) a resin containing a repeating unit represented by the following formula (Ia) and a repeating unit represented by formula (Ib), which is a resin having an aliphatic cyclic hydrocarbon group on the side chain and capable of increasing the dissolution rate in an alkali developer under the action of an acid, (B) a compound capable of generating an acid upon irradiation with actinic rays or radiation, and (C) a fluorine-containing surfactant and/or a silicon-containing surfactant:

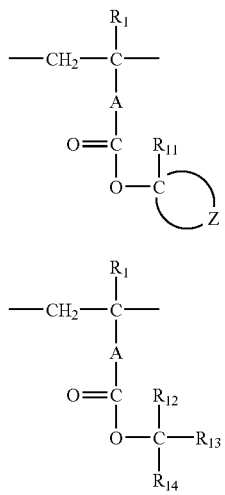
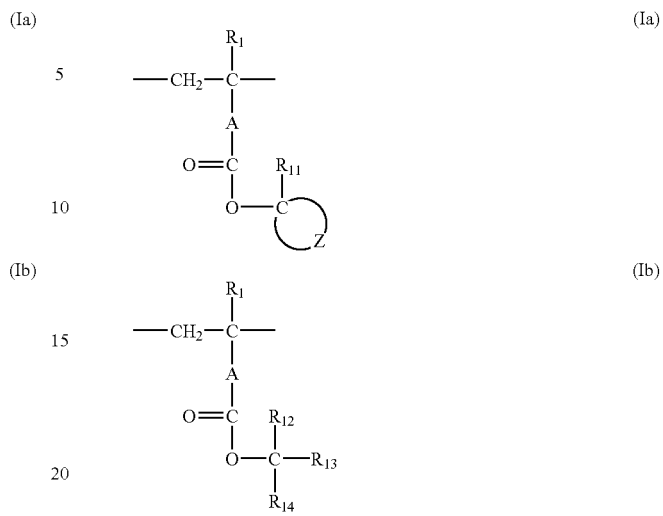

wherein in formulae (Ia) and (Ib), each $R_1$ independently represents a hydrogen atom or an alkyl group and A represents a linking group, in formula (Ia), $R_{11}$ represents an alkyl group having from 1 to 4 carbon atoms and Z represents an atomic group necessary for forming an alicyclic hydrocarbon group together with the carbon atom, in formula (Ib), $R_{12}$ to $R_{14}$ each independently represents a hydrocarbon group, provided that at least one of $R_{12}$ to $R_{14}$ represents an alicyclic hydrocarbon group, and wherein the total content of both the repeating unit represented by formula (Ia) and the repeating unit represented by formula (Ib) in the resin as the component (A) is from 30 to 70 mol %, based on all repeating structural units.

2. The positive resist composition as claimed in claim 1, which further contains (D) an organic basic compound.

3. The positive resist composition as claimed in claim 1, wherein the molar ratio of the repeating unit represented by formula (Ia) to the repeating unit represented by formula (Ib) in the resin is from 99/1 to 1/99.

4. The positive resist composition as claimed in claim 1, wherein the resin as the component (A) has a weight average molecular weight of from 1,000 to 200,000.

5. A positive resist composition comprising (A) a resin (Aa) containing a repeating unit represented by the following formula (Ia) and a resin (Ab) containing a repeating unit represented by formula (Ib), which are a resin having an aliphatic cyclic hydrocarbon group on the side chain and capable of increasing the dissolution rate in an alkali developer under the action of an acid, and (B) a compound capable of generating an acid upon irradiation with actinic rays or radiation:

wherein in formulae (Ia) and (Ib), each $R_1$ independently represents a hydrogen atom or an alkyl group and A represents a linking group, in formula (Ia), $R_{11}$ represents an alkyl group having from 1 to 4 carbon atoms and Z represents an atomic group necessary for forming an alicyclic hydrocarbon group together with the carbon atom, and in formula (Ib), $R_{12}$ to $R_{14}$ each independently represents a hydrocarbon group, provided that at least one of $R_{12}$ to $R_{14}$ represents an alicyclic hydrocarbon group.

6. The positive resist composition as claimed in claim 5, which further contains (C) a fluorine-containing surfactant and/or a silicon-containing surfactant.

7. The positive resist composition as claimed in claim 5, which further contains (D) an organic basic compound.

8. The positive resist composition as claimed in claim 5, wherein the content of the repeating unit represented by formula (Ia) in the resin (Aa) is from 30 to 70 mol %, based on all repeating unit structural units.

9. The positive resist composition as claimed in claim 5, wherein the content of the repeating unit represented by formula (Ib) in the resin (Ab) is from 30 to 70 mol %, based on all repeating unit structural units.

10. The positive resist composition as claimed in claim 5, wherein the weight ratio of the resin (Aa) to the resin (Ab) is from 99:1 to 1:99.

11. The positive resist composition as claimed in claim 1, wherein the total content of both the repeating unit represented by formula (Ia) and the repeating unit represented by formula (Ib) in the resin as the component (A) is from 48 to 60 mol %, based on all repeating structural units.

* * * * *